(12) United States Patent
Mitsumoto et al.

(10) Patent No.: US 7,858,291 B2
(45) Date of Patent: *Dec. 28, 2010

(54) LITHOGRAPHIC PRINTING PLATE PRECURSOR, METHOD FOR PREPARATION OF LITHOGRAPHIC PRINTING PLATE PRECURSOR, AND LITHOGRAPHIC PRINTING METHOD

(75) Inventors: Tomoyoshi Mitsumoto, Shizuoka (JP); Akihiro Endo, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 449 days.

This patent is subject to a terminal disclaimer.

(21) Appl. No.: 11/362,155

(22) Filed: Feb. 27, 2006

(65) Prior Publication Data
US 2006/0194150 A1    Aug. 31, 2006

(30) Foreign Application Priority Data

Feb. 28, 2005   (JP)   ............. P.2005-054181
Mar. 25, 2005   (JP)   ............. P.2005-088354

(51) Int. Cl.
*G03F 7/00* (2006.01)
*G03F 7/26* (2006.01)

(52) U.S. Cl. .......... 430/302; 430/434; 430/435; 101/450.1

(58) Field of Classification Search .......... 430/237.1, 430/270.1, 273.1, 302, 434, 435
See application file for complete search history.

(56) References Cited

U.S. PATENT DOCUMENTS

| | | | | |
|---|---|---|---|---|
| 5,141,969 | A | * | 8/1992 | Saeva et al. ............ 522/31 |
| 5,221,330 | A | * | 6/1993 | Matsumoto et al. ...... 106/2 |
| 5,302,438 | A | * | 4/1994 | Komamura et al. ...... 428/195.1 |
| 5,739,087 | A | * | 4/1998 | Dennis .............. 508/144 |
| 6,300,047 | B1 | * | 10/2001 | Massucco et al. ....... 430/519 |
| 2002/0028288 | A1 | * | 3/2002 | Rohrbaugh et al. ..... 427/180 |
| 2002/0182538 | A1 | * | 12/2002 | Tomita et al. ........ 430/278.1 |
| 2003/0082475 | A1 | * | 5/2003 | Teng .................. 430/176 |
| 2003/0198893 | A1 | * | 10/2003 | Oshima .............. 430/273.1 |
| 2004/0191691 | A1 | * | 9/2004 | Ohta et al. ........... 430/281.1 |
| 2005/0069811 | A1 | * | 3/2005 | Mitsumoto et al. ..... 430/270.1 |
| 2006/0046194 | A1 | * | 3/2006 | Hoshi et al. .......... 430/270.1 |
| 2006/0068327 | A1 | * | 3/2006 | Mori et al. ........... 430/281.1 |

FOREIGN PATENT DOCUMENTS

| | | | |
|---|---|---|---|
| EA | 1 457 321 | A1 | 9/2004 |
| EP | 0 251 621 | A2 | 1/1988 |
| EP | 0 516 372 | A | 12/1992 |
| EP | 0 542 266 | A2 | 5/1993 |
| EP | 1 378 348 | A2 | 1/2004 |
| JP | 07168353 | A * | 7/1995 |
| JP | 2938397 | B2 | 6/1999 |
| JP | 2000-39711 | A | 2/2000 |
| JP | 2001-277740 | A | 10/2001 |
| JP | 2001-277742 | A | 10/2001 |
| JP | 2002-287334 | A | 10/2002 |
| WO | WO-2006/036253 | A2 | 4/2006 |

OTHER PUBLICATIONS

Abdalla, David J. & Weiss, Richard G., The Influence of the Cationic Center, Anion, and Chain Length of Tetra-n-alkylammonium and -phosphonium Salt Gelators on the Properties of Their Thermally Reversible Organogels, Jan. 14, 2000, American Chemical Society, vol. 12, pp. 406-413.*

Kamena Karl: "Product Commercialization- One Nanostep at a Time" conference "functional fillers for plastics 2004" [online]. Sep. 15, 2004 (XP02497453).*

Kamena Karl: "product Commercialization- One Nanostep at a Time" conference "functional fillers for plastics 2004" [online] Sep. 15, 2004 (XP02497453).*

Karl Kamena; "Product Commercialization—One Nanostep at a Time"; Conference "Functional Fillers for Plastics 2004"; Sep. 15, 2004.

* cited by examiner

*Primary Examiner*—Shean C Wu
*Assistant Examiner*—Chanceity N Robinson
(74) *Attorney, Agent, or Firm*—Birch, Stewart, Kolasch & Birch, LLP

(57) ABSTRACT

A lithographic printing plate precursor comprising: a support; an image-recording layer; and a protective layer containing an inorganic stratiform compound, provided in this order, wherein the inorganic stratiform compound contains an organic cation.

10 Claims, No Drawings

LITHOGRAPHIC PRINTING PLATE PRECURSOR, METHOD FOR PREPARATION OF LITHOGRAPHIC PRINTING PLATE PRECURSOR, AND LITHOGRAPHIC PRINTING METHOD

FIELD OF THE INVENTION

The present invention relates to a lithographic printing plate precursor capable of undergoing a so-called direct plate-making, which can be directly plate-made by scanning of laser beam based on digital signals, for example, a computer, and more particularly, it relates to a lithographic printing plate precursor providing a lithographic printing plate which has stable inking property (ink-receptive property) during printing and is excellent in printing durability, a method for preparation of the lithographic printing plate precursor, and a lithographic printing method using the lithographic printing plate precursor.

BACKGROUND OF THE INVENTION

In general, a lithographic printing plate is composed of an oleophilic image area accepting ink and a hydrophilic non-image area accepting dampening water (fountain solution) in the process of printing. Lithographic printing is a printing method utilizing the nature of dampening water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) has heretofore been broadly used. Ordinarily, the lithographic printing plate is obtained by conducting plate-making according to a method of exposing the lithographic printing plate precursor through an original, for example, a lith film, and then while leaving the image area of the image-recording layer, removing the image-recording layer in other unnecessary areas by dissolving with an alkaline developer or an organic solvent thereby revealing the hydrophilic surface of support.

In the hitherto known plate-making process of lithographic printing plate precursor, after exposure, the step of removing the unnecessary image-recording layer by dissolving, for example, with a developer is required. However, it is one of the subjects to save or simplify such an additional wet treatment described above. Particularly, since disposal of liquid wastes discharged accompanying the wet treatment has become a great concern throughout the field of industry in view of the consideration for global environment in recent years, the demand for the solution of the above-described subject has been increased more and more.

As one of simple plate-making methods in response to the above-described requirement, a method referred to as on-machine development has been proposed wherein a lithographic printing plate precursor having an image-recording layer capable of being removed in the unnecessary areas during a conventional printing process is used and after exposure, the non-image area of the image-recording layer is removed on a printing machine to prepare a lithographic printing plate.

Specific methods of the on-machine development include, for example, a method of using a lithographic printing plate precursor having an image-recording layer that can be dissolved or dispersed in dampening water, an ink solvent or an emulsion of dampening water and ink, a method of mechanically removing an image-recording layer by contact with rollers or a blanket cylinder of a printing machine, and a method of lowering cohesion of an image-recording layer or adhesion between an image-recording layer and a support upon penetration of dampening water, ink solvent or the like and then mechanically removing the image-recording layer by contact with rollers or a blanket cylinder of a printing machine.

In the invention, unless otherwise indicated particularly, the term "development processing step" means a step of using an apparatus (ordinarily, an automatic developing machine) other than a printing machine and removing an unexposed area in an image-recording layer of a lithographic printing plate precursor upon contact with liquid (ordinarily, an alkaline developer) thereby revealing a hydrophilic surface of support. The term "on-machine development" means a method and a step of removing an unexposed area in an image-recording layer of the lithographic printing plate precursor upon contact with liquid (ordinarily, printing ink and/or dampening water) by using a printing machine thereby revealing a hydrophilic surface of support.

On the other hand, digitalized technique of electronically processing, accumulating and outputting image information using a computer has been popularized in recent years, and various new image-outputting systems responding to the digitalized technique have been put into practical use. Correspondingly, attention has been drawn to a computer-to-plate technique of carrying digitalized image information on highly converging radiation, for example, a laser beam and conducting scanning exposure of a lithographic printing plate precursor with the radiation thereby directly preparing a lithographic printing plate without using a lith film. Thus, it is one of important technical subjects to obtain a lithographic printing plate precursor adaptable to the technique described above.

As described above, in recent years, the simplification of plate-making operation and the realization of dry system and non-processing system have been further strongly required from both aspects of the consideration for global environment and the adaptation for digitization.

As such a lithographic printing plate precursor, for example, a lithographic printing plate precursor comprising a hydrophilic support having provided thereon an image-forming layer containing a hydrophobic thermoplastic polymer particles dispersed in a hydrophilic binder is known (refer to, for example, Japanese Patent 2,938,397). The lithographic printing plate precursor can be subjected to the on-press development by exposing with an infrared laser, fusing and coalescing the hydrophobic thermoplastic polymer particles by heat to form an image, loading on a cylinder of a printing machine, and supplying dampening water and/or ink.

However, such a method of forming an image by coalescence due to mere heat fusion of polymer fine particles certainly shows good on-machine developing property, but the image strength is extremely weak and printing durability is insufficient.

In order to improve a lithographic printing plate precursor capable of being subjected to on-machine development in the printing durability, a lithographic printing plate precursor comprising a hydrophilic support having provided thereon a heat-sensitive layer containing microcapsules containing a compound having a functional group reactive with heat, wherein the heat-sensitive layer or a layer adjacent to the heat-sensitive layer contains an infrared absorber, is proposed (refer to JP-A 2001-277740 (the term "JP-A" as used herein means an "unexamined published Japanese patent application") and JP-A-2001-277742).

However, the technique is still insufficient in view of practical printing durability.

Also, as another technique for improving the printing durability, a lithographic printing plate precursor capable of being subjected to on-machine development which comprises a support having provided thereon a photosensitive layer containing an infrared absorber, a radical polymerization initiator and a polymerizable compound is known (refer to JP-A-2002-287334). Further, a lithographic printing plate precursor capable of being subjected to on-machine development after exposure which comprises an aluminum support provided thereon a photosensitive composition containing (a) a water-soluble or water-dispersible polymer, (b) a monomer or oligomer having a photopolymerizable ethylenically unsaturated double bond, and (c) a photopolymerization initiation system having an absorption maximum in an ultraviolet region is described in JP-A-2000-39711.

In these methods of using a reaction, for example, a polymerization reaction, the density of chemical bonding of the image area is high as compared with the image area formed by the heat fusion of polymer fine particles, therefore it is possible to increase image strength. However, they are still insufficient from the standpoint of satisfying both of the on-machine developing property and fine line reproducibility or printing durability, and further improvements have been desired.

On the other hand, in a lithographic printing plate precursor utilizing a radical polymerization reaction, a protective layer (an overcoat layer) is provide on an image-recording layer for the purpose of preventing the generation of scratches, blocking oxygen, preventing ablation by the exposure with a high illuminance laser beam or the like. Although a layer containing a water-soluble polymer compound as a main component has been heretofore used as the protective layer, such a layer is still insufficient for satisfying all of the on-machine developing property, fine line reproducibility, printing durability, ink-receptive property and on-machine development running property (aptitude, for example, mixing of the substances removed by the on-machine development in dampening water by continuously repeating the on-machine development and printing). Therefore, further improvements have been desired.

SUMMARY OF THE INVENTION

The present invention aims to solve the problems of the above-described prior art. More specifically, an object of the invention is to provide a lithographic printing plate precursor which is capable of being image-recorded with a laser beam, which exhibits good on-machine developing property, and which is excellent in ink-receptive property and printing durability, and a method for preparation of the lithographic printing plate precursor. Another object of the invention is to provide a lithographic printing method which exhibits good on-machine developing property, and which is excellent in ink-receptive property and printing durability.

As a result of various investigations to resolve the above-described problems, the inventor has found that the above-described objects can be achieved by effectively using an organic cation.

Specifically, the present invention includes the following items.

1. A lithographic printing plate precursor comprising a support having thereon an image-recording layer and a protective layer containing an inorganic stratiform compound in this order, wherein the inorganic stratiform compound contains an organic cation.

2. The lithographic printing plate precursor as described in 1 above, wherein the inorganic stratiform compound has a particle size of 1 μM or more.

3. The lithographic printing plate precursor as described in 1 or 2 above, wherein the image-recording layer contains (A) an active ray absorbing agent, (B) a polymerization initiator, and (C) a polymerizable compound.

4. The lithographic printing plate precursor as described in any one of 1 to 3 above, wherein the image-recording layer is capable of being removed with dampening water and/or ink.

5. A method for preparation of a lithographic printing plate precursor comprising forming an image-recording layer on a support, and coating on the image-recording layer, an aqueous solution containing an inorganic stratiform compound and an organic cationic compound to form a protective layer.

6. A lithographic printing plate precursor comprising a support having thereon an image-recording layer which is capable of forming an image by supplying oily ink and an aqueous component on a printing machine after exposure to remove an unexposed area and a protective layer on the image-recording layer, wherein the image-recording layer and/or the protective layer contain a phosphonium compound represented by the following formula (I):

Formula (I):

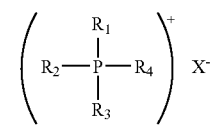

wherein $R_1$ to $R_4$ each independently represents an alkyl group, an alkenyl group, an alkynyl group, a cycloalkyl group, an alkoxy group, an aryl group, an aryloxy group, an alkylthio group, an arylthio group, a heterocyclic group or a hydrogen atom, or at least two of $R_1$ to $R_4$ may be combined with each other to from a ring, and $X^-$ represents an anion.

7. The lithographic printing plate precursor as described in 6 above, wherein the anion represented by $X^-$ in formula (I) is $Cl^-$, $Br^-$, $I^-$ or an organic carboxylic acid anion or organic sulfonic acid anion having a substituent selected from an alkyl group, an alkenyl group, an alkynyl group, a cycloalkyl group, an alkoxy group, an aryl group, an aryloxy group, an alkylthio group and a heterocyclic group.

8. The lithographic printing plate precursor as described in 6 or 7 above, wherein the image-recording layer contains (A1) an infrared absorbing agent, (B) a polymerization initiator, (C) a polymerizable compound, and (D) a binder polymer.

9. The lithographic printing plate precursor as described in any one of 6 to 8 above, wherein the protective layer contains an inorganic stratiform compound.

10. A lithographic printing method comprising after exposure, supplying oily ink and dampening water to a lithographic printing plate precursor on a printing machine to remove an unexposed area of an image-recording layer of the lithographic printing plate precursor and conducting printing wherein the dampening water contains a phosphonium compound represented by the following formula (I):

Formula (I):

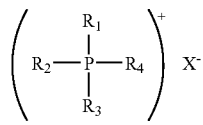

wherein $R_1$ to $R_4$ each independently represents an alkyl group, an alkenyl group, an alkynyl group, a cycloalkyl group, an alkoxy group, an aryl group, an aryloxy group, an alkylthio group, an arylthio group, a heterocyclic group or a hydrogen atom, or at least two of $R_1$ to $R_4$ may be combined with each other to from a ring, and $X^-$ represents an anion.

In general, a phosphonium compound has been heretofore known as a photosensitive acid generator as described, for example, in JP-A-50-158698. It is also known as described, for example, in JP-A-5-112085 that the phosphonium compound is added to dampening water to function as a protective agent for an image area of PS plate. However, there is neither disclosure nor suggestion of how to achieve the object in that while maintaining the penetration of dampening water at the on-machine development, removal of a protective layer mainly composed of a hydrophilic resin in the exposed area and prevention of the readsorption thereof are performed in a lithographic printing plate precursor system of the on-machine development type as in the present invention.

According to the present invention, a lithographic printing plate precursor which is capable of being image-recorded with a laser beam, which exhibits good on-machine developing property, and which is excellent in ink-receptive property and printing durability, and a method for preparation of the lithographic printing plate precursor are provided.

Also, according to the present invention, a lithographic printing method which exhibits good on-machine developing property, and which is stable in ink-receptive property during the printing and excellent in printing durability while maintaining preferable reproducibility of printing image is provided using a lithographic printing plate precursor which is capable of being image-recorded with a laser beam and subjected to on-machine development.

DETAILED DESCRIPTION OF THE INVENTION

[Lithographic Printing Plate Precursor]

The lithographic printing plate precursor according to the invention comprises an image-recording layer and a protective layer in this order on a support. The lithographic printing plate precursors described in claims 1 to 4 are characterized in that the protective layer contains an inorganic stratiform compound and that the inorganic stratiform compound contains an organic cation (hereinafter, referred to as a first embodiment of the invention). The lithographic printing plate precursors described in claims 6 to 9 are characterized in that the image-recording layer and/or the protective layer contains a specific phosphonium compound (hereinafter, referred to as a second embodiment of the invention).

The elements and components constituting the lithographic printing plate precursor according to the invention will be described in detail below.

(Protective Layer)

In the lithographic printing plate precursor according to the invention, a protective layer is provided on the image-recording layer for the purpose of preventing occurrence of scratches, blocking oxygen, preventing ablation upon exposure with a high illuminance laser beam or the like.

The protective layer according to the first embodiment of the invention will be described below.

The inorganic stratiform compound used in the protective layer according to the invention is a particle having a thin tabular shape and includes an organic cation as a counter ion. As the inorganic stratiform compound containing an organic cation, that previously synthesized may be used, or it may be prepared by salt exchange between an inorganic stratiform compound having an inorganic cation as the counter ion and an organic cationic compound in a coating solution for protective layer.

The inorganic stratiform compound prior to counter ionization with an organic cation includes, for example, mica, for example, natural mica represented by the following formula (II):

(wherein A represents any one of $Li^+$, $K^+$, $Na^+$, $Ca^{2+}$ and $Mg^{2+}$, B and C each represents any one of Fe(II), Fe(III), Mn, Al, Mg and V, and D represents Si or Al) or synthetic mica; talc represented by the following formula: $3MgO.4SiO.H_2O$; teniolite; montmorillonit; saponite; hectolite; and zirconium phosphate.

Of the micas, examples of the natural mica include muscovite, paragonite, phlogopite, biotite and lepidolite. Examples of the synthetic mica include non-swellable mica, for example, fluorine phlogopite $KMg_3(AlSi_3O_{10})F_2$ or potassium tetrasilic mica $KMg_{2.5}(Si_4O_{10})F_2$, and swellable mica, for example, Na tetrasililic mica $NaMg_{2.5}(Si_4O_{10})F_2$, Na or Li teniolite $(Na, Li)Mg_2Li(Si_4O_{10})F_2$, or montmorillonit based Na or Li hectolite $(Na, Li)_{1/8}Mg_{2/5}Li_{1/8}(Si_4O_{10})F_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonit, saponite, hectoliter or bentonite have a stratiform structure comprising a unit crystal lattice layer having thickness of approximately 10 to 15 angstroms and metallic atom substitution in the lattices is extremely large in comparison with other clay minerals. As a result, the lattice layer results in lack of positive charge and to compensate it, cations, for example, $Li^+$, $Na^+$, $Ca^{2+}$ or $Mg^{2+}$, are adsorbed between the lattice layers. The inorganic stratiform compound swells with water. When share is applied under such condition, the stratiform crystal lattices are easily cleaved to form a stable sol in water. The bentnite and swellable synthetic mica have strong such tendency and are useful in the invention. Particularly, the swellable synthetic mica is preferably used.

The inorganic stratiform compound containing an organic cation according to the invention includes compounds represented by formula (II) wherein A is an organic cation and compounds wherein the cations adsorbed between the lattice layers are organic cations.

The organic cation used in the invention is a cation of an organic cationic compound (for example, an amine salt, a quaternary ammonium salt, a phosphonium salt or a sulfonium salt).

Specific examples of the amine salt include a primary amine salt (for example, a compound represented by formula (1) shown below), a secondary amine salt (for example, a compound represented by formula (2) shown below), a tertiary amine salt (for example, a compound represented by formula (3) shown below), a modified amine salt (for example, compounds represented by formulae (4) to (6) shown below) and an imidazoline type amine salt (for example, a compound represented by formula (7) shown below).

Specific examples of the quaternary ammonium salt include compounds represented by formulae (8) to (15) shown below, pyridinium salts represented by formulae (16) to (19) shown below, an alkylquinolinium salt represented by formula (20) shown below, an imidazolinium salt represented by formula (21) shown below and a benzimidazolinium salt represented by formula (22) shown below.

Specific examples of the phosphonium salt include a compound represented by formula (23) shown below, and specific examples of the sulfonium salt include a compound represented by formula (24) shown below.

(1)

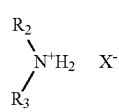
(2)

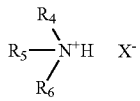
(3)

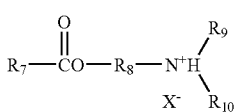
(4)

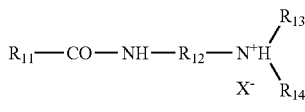
(5)

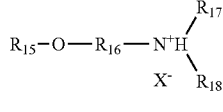
(6)

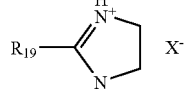
(7)

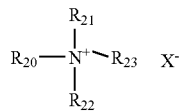
(8)

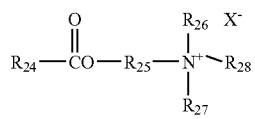
(9)

-continued

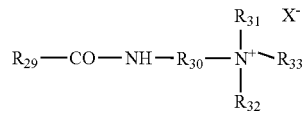
(10)

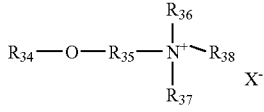
(11)

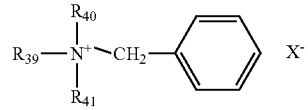
(12)

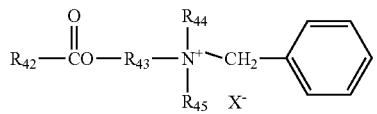
(13)

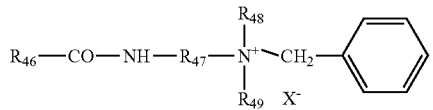
(14)

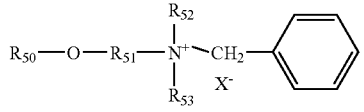
(15)

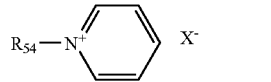
(16)

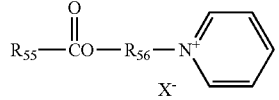
(17)

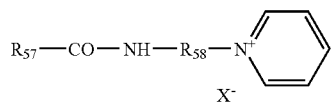
(18)

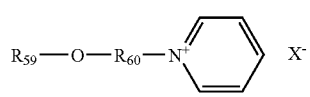
(19)

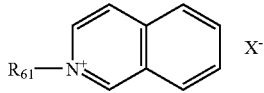
(20)

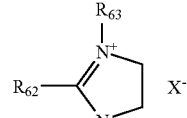
(21)

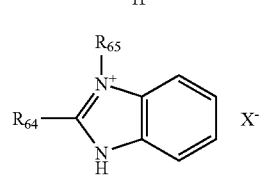
(22)

-continued

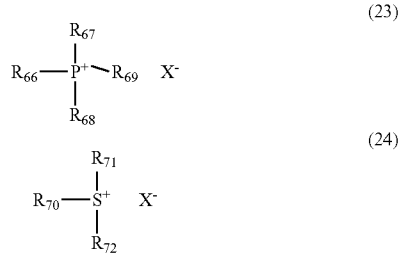

In the formulae shown above, $R_1$, $R_2$, $R_3$, $R_4$, $R_5$, $R_6$, $R_7$, $R_9$, $R_{10}$, $R_{11}$, $R_{13}$, $R_{14}$, $R_{15}$, $R_{17}$, $R_{18}$, $R_{19}$, $R_{20}$, $R_{21}$, $R_{22}$, $R_{23}$, $R_{24}$, $R_{26}$, $R_{27}$, $R_{28}$, $R_{29}$, $R_{31}$, $R_{32}$, $R_{33}$, $R_{34}$, $R_{36}$, $R_{37}$, $R_{38}$, $R_{39}$, $R_{40}$, $R_{41}$, $R_{42}$, $R_{44}$, $R_{45}$, $R_{46}$, $R_{48}$, $R_{49}$, $R_{50}$, $R_{52}$, $R_{53}$, $R_{54}$, $R_{55}$, $R_{57}$, $R_{59}$, $R_{61}$, $R_{62}$, $R_{63}$, $R_{64}$, $R_{65}$, $R_{66}$, $R_{67}$, $R_{68}$, $R_{69}$, $R_{70}$, $R_{71}$ and $R_{72}$ each independently represents a monovalent saturated or unsaturated hydrocarbon group having from 1 to 24 carbon atoms, which may have a substituent or may have an ethylene oxy group or a propylene oxy group in the molecule thereof. The monovalent saturated or unsaturated hydrocarbon group may be a chain form or a cyclic form. Examples of the monovalent saturated or unsaturated hydrocarbon group include an alkyl group, a cycloalkyl group, an alkenyl group, a cycloalkenyl group, an aryl group, an aralkyl group, a phenyl group and a benzyl group. Examples of the substituent include a halogen atom or a hydroxy group.

In the formulae shown above, $R_8$, $R_{12}$, $R_{16}$, $R_{25}$, $R_{30}$, $R_{35}$, $R_{43}$, $R_{47}$, $R_{51}$, $R_{56}$, $R_{58}$ and $R_{60}$ each independently represents a divalent saturated or unsaturated hydrocarbon group having from 1 to 24 carbon atoms, which may have a substituent or may have an ethylene oxy group or a propylene oxy group in the molecule thereof. The divalent saturated or unsaturated hydrocarbon group may be a chain form or a cyclic form. Examples of the divalent saturated or unsaturated hydrocarbon group include an alkylene group, a cycloalkylene group, an alkenylene group, a cycloalkenylene group, an arylene group and an aralkylene group. Examples of the substituent include a halogen atom or a hydroxy group. $X^-$ represents an anion.

An inorganic cation may be used together with the organic cation as long as the effect of the invention is not impaired.

The inorganic stratiform compound may be previously counter-ionized with an organic cation or it may be prepared by salt exchange between an inorganic stratiform compound having an inorganic cation and a compound having an organic cation in a coating solution for protective layer.

With respect to the shape of the inorganic stratiform compound used in the invention, the thinner the thickness or the larger the plain size as long as smoothness of coated surface and transmission of active ray are not damaged, the better from the standpoint of control of diffusion. Therefore, an aspect ratio of the inorganic stratiform compound is ordinarily 20 or more, preferably 100 or more, and particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average particle size is ordinarily from 1 to 20 μm, preferably from 1 to 10 μm, and particularly preferably from 2 to 5 μm. When the particle size is less than 1 μm, the inhibition of permeation of oxygen or water is insufficient and the effect of the invention can not be satisfactorily achieved. On the other hand, when it is larger than 20 μm, the dispersion stability of the particle in the coating solution is insufficient to cause a problem in that stable coating can not be performed. An average thickness of the particle is ordinarily 0.1 μm or less, preferably 0.05 μm or less, and particularly preferably 0.01 μm or less. For example, with respect to the swellable synthetic mica that is the representative compound of the inorganic stratiform compounds, the thickness is approximately from 1 to 50 nm and the plain size is approximately from 1 to 20 μm.

By incorporating particles of the inorganic stratiform compound having such a large aspect ratio into the protective layer, strength of the coated layer increases and the penetration of oxygen or water can be effectively inhibited, thereby preventing degradation of the protective layer due to deformation. Also, even when the lithographic printing plate precursor is stored under a high humidity condition for a long period of time, degradation of the image-forming property of the lithographic printing plate precursor due to the variation of humidity is prevented and the excellent preservation stability is obtained.

An amount of the inorganic stratiform compound contained in the protective layer is ordinarily from 5/1 to 1/100 in terms of a weight ratio of the inorganic stratiform compound to an amount of a binder used in the protective layer. When a plural kind of the inorganic stratiform compounds is used together, it is preferred that the total amount of the inorganic stratiform compounds is in the range of weight ratio described above.

In the invention, the exposure is ordinarily conducted in the atmosphere, and the protective layer prevents invasion of a low molecular compound that hinders a image-forming reaction initiated by the image exposure in the image-recording layer, for example, oxygen or a basic substance present in the atmosphere thereby preventing the hindrance of the image-forming reaction by the exposure in the atmosphere. Accordingly, characteristics desired to the protective layer preferably include that it has good permeation of light used for exposure, that it is excellent in adhesion to the image-recording layer and that it can be easily removed by the on-machine developing step after exposure as well as it has low permeability of the low molecular compound, for example, oxygen. The protective layer having such characteristics has been heretofore variously studied and described in detail, for example, in U.S. Pat. No. 3,458,311 and JP-B-55-49729 (the term "JP-B" as used herein means an "examined Japanese patent publication").

In the protective layer, it is preferred to use a binder together with the inorganic stratiform compound.

The binder is not particularly restricted as long as it has good dispersibility of the inorganic stratiform compound and is capable of forming a uniform layer closely contact with the image-recording layer. Any water-soluble polymer and water-insoluble polymer can be appropriately selected to use. Specific examples of the binder include a water-soluble polymer, for example, polyvinyl alcohol, modified polyvinyl alcohol, polyvinyl pyrrolidone, polyvinyl imidazole, polyacrylic acid, polyacrylamide, partially saponified product of polyvinyl acetate, ethylene-vinyl alcohol copolymer, water-soluble cellulose derivative, gelatin, starch derivative or gum arabic, and a polymer, for example, polyvinylidene chloride, poly(meth)acrylonitrile, polysulfone, polyvinyl chloride, polyethylene, polycarbonate, polystyrene, polyamide or cellophane. The polymers may be used in combination of two or more thereof, if desired.

Of the polymers, the water-soluble polymer, for example, polyvinyl alcohol, polyvinyl pyrrolidone, polyvinyl imidazole, a water-soluble acrylic resin, e.g., polyacrylic acid, gelatin or gum arabic is preferably used in view of easiness of removal of the protective layer remaining in the non-image area and handling property at the time of formation of the layer. Above all, polyvinyl alcohol, polyvinyl pyrrolidone, gelatin and gum arabic are more preferably used from the standpoint of capability of coating with water as a solvent and easiness of removal with dampening water at printing.

The polyvinyl alcohol for use in the protective layer according to the invention may be partially substituted with ester, ether and acetal as long as it contains a substantial amount of unsubstituted vinyl alcohol units necessary for maintaining water solubility. Also, the polyvinyl alcohol may partially contain other copolymerization components. For instance, polyvinyl alcohols of various polymerization degrees having at random a various kind of hydrophilic modified cites, for example, an anion-modified cite modified with an anion, e.g., a carboxy group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer having a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are also preferably used.

Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 all produced by Kuraray Co., Ltd. Specific examples of the modified polyvinyl alcohol include that having an anion-modified cite, for example, KL-318, KL-118, KM-618, KM-118 or SK-5102, that having a cation-modified cite, for example, C-318, C-118 or CM-318, that having a terminal thiol-modified cite, for example, M-205 or M-115, that having a terminal sulfide-modified cite, for example, MP-103, MP-203, MP-102 or MP-202, that having an ester-modified cite with a higher fatty acid at the terminal, for example, HL-12E or HL-1203 and that having a reactive silane-modified cite, for example, R-1130, R-2105 or R-2130.

An example of ordinary dispersing methods of the inorganic stratiform compound used in the protective layer is described below. Specifically, at first, from 5 to 10 parts by weight of a swellable stratiform compound that is exemplified as a preferred inorganic stratiform compound is added to 100 parts by weight of water to adapt thoroughly the compound to water and to be swollen, and then the mixture is dispersed using a dispersing machine. The dispersing machine used include, for example, a variety of mills conducting dispersion by directly applying mechanical power, a high-speed agitation type dispersing machine providing a large shear force and a dispersing machine providing ultrasonic energy of high intensity. Specific examples thereof include a ball mill, a sand grinder mill, a visco mill, a colloid mill, a homogenizer, a dissolver, a Polytron, a homomixer, a homoblender, a Keddy mill, a jet agitor, a capillary emulsifying device, a liquid siren, an electromagnetic strain type ultrasonic generator and an emulsifying device having a Polman whistle. The dispersion containing 5 to 10% by weight of the inorganic stratiform compound thus prepared is highly viscous or in the form of gel and exhibits extremely good preservation stability. In the preparation of a coating solution for protective layer using the dispersion, it is preferred that the dispersion is diluted with water, thoroughly stirred and then blended with a binder solution.

To the coating solution for protective layer can be added known additives, for example, a surfactant for improving a coating property or a water-soluble plasticizer for improving physical properties of a coated layer. Examples of the water-soluble plasticizer include propionamide, cyclohexanediol, glycerin or sorbitol. Also, a water-soluble (meth)acrylic polymer may be added. Further, to the coating solution may be added known additives for improving adhesion to the image-recording layer or time-lapse stability of the coating solution.

The thus-prepared coating solution for protective layer is coated on the image-recording layer provided on the support and dried to form a protective layer. A coating solvent can be appropriately selected in the relationship with the binder used. When a water-soluble polymer is used, it is preferred to employ distilled water or purified water as the coating solvent. A coating method of the protective layer is not particularly restricted and known methods, for example, methods disclosed in U.S. Pat. No. 3,458,311 and JP-B-55-49729 can be used. Specifically, the protective layer is coated, for example, by a blade coating method, an air knife coating method, a gravure coating method, a roll coating method, a spray coating method, a dip coating method or a bar coating method.

A coating amount of the protective layer is preferably in a range from 0.01 to 10 g/m², more preferably in a range from 0.02 to 3 g/m², and most preferably in a range from 0.02 to 1 g/m², in terms of coating amount after drying.

Now, the protective layer according to the second embodiment of the invention is described below.

The phosphonium compound which can be incorporated into the protective layer according to the second embodiment is represented by formula (I) shown below. The phosphonium compound has a function of stabilizing ink-receptive property in the image area without degradation of the on-machine developing property.

Formula (I):

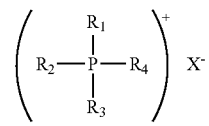

wherein $R_1$ to $R_4$ each independently represents an alkyl group, an alkenyl group, an alkynyl group, a cycloalkyl group, an alkoxy group, an aryl group, an aryloxy group, an alkylthio group, an arylthio group, a heterocyclic group or a hydrogen atom, or at least two of $R_1$ to $R_4$ may be combined with each other to from a ring, and $X^-$ represents an anion.

When $R_1$ to $R_4$ each independently represents the alkyl group, alkoxy group or alkylthio group, a carbon number thereof is ordinarily from 1 to 20. When $R_1$ to $R_4$ each independently represents the alkenyl group or alkynyl group, a carbon number thereof is ordinarily from 2 to 15. When $R_1$ to $R_4$ each independently represents the cycloalkyl group, a carbon number thereof is ordinarily from 3 to 8. Examples of the aryl group include a phenyl group and a naphthyl group, examples of the aryloxy group include a phenoxy group and a naphthoxy group, examples of the arylthio group include a phenylthio group, and examples of the heterocyclic group include a furyl group and a thienyl group. Examples of the substituent which may be contained in these groups include an alkyl group, an alkenyl group, an alkynyl group, a cycloalkyl group, an alkoxy group, an alkoxycarbonyl group, an acyl group, an alkylthio group, an aryl group, an aryloxy group, an arylthio group, a sulfino group, a sulfo group, a phophino group, a phophoryl group, an amino group, a nitro group, a cyano group, a hydroxy group and a halogen atom. The substituent may further have a substituent.

The anion represented by $X^-$ includes an inorganic acid anion, for example, $Cl^-$, $Br^-$, $I^-$, $ClO_4^-$ or $SO_4^{2-}$, an organic carboxylic acid anion or an organic sulfonic acid anion. Examples of the organic group contained in the organic carboxylic acid anion or organic sulfonic acid anion include a methyl, ethyl, propyl, butyl, phenyl, methoxyphenyl, naphthyl, fluorophenyl, difluorophenyl, pentafluorophenyl, thienyl and pyrrolyl group.

The anion represented by $X^-$ preferably includes an inorganic acid anion, for example, $Cl^-$, $Br^-$ or $I^-$, an organic carboxylic acid anion or an organic sulfonic acid anion having a substituent selected from, for example, an alkyl group, an alkenyl group, an alkynyl group, a cycloalkyl group, an alkoxy group, an aryl group, an aryloxy group, an alkylthio group and a heterocyclic group. The substituent may further have a substituent.

Specific examples of the phosphonium compound preferably used in the invention are set forth below.

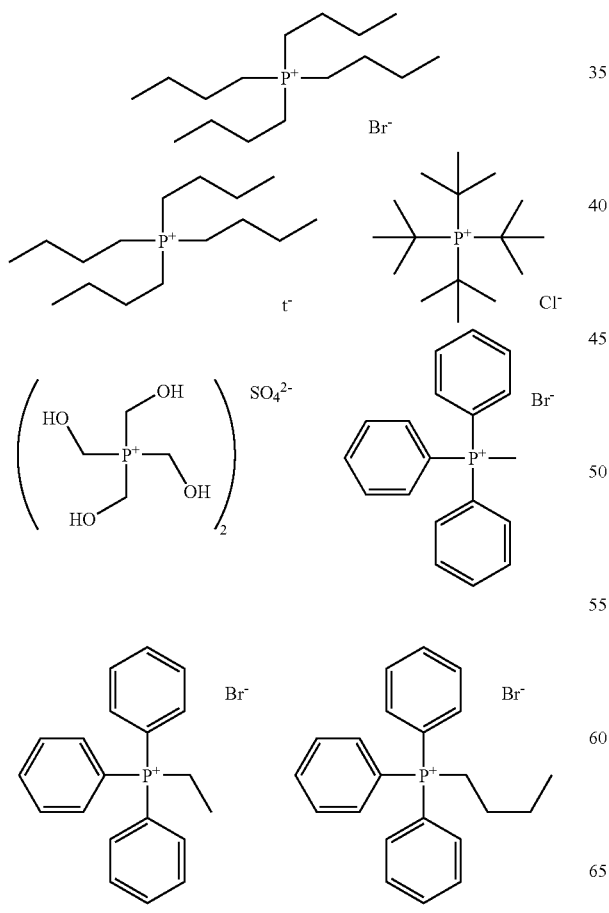

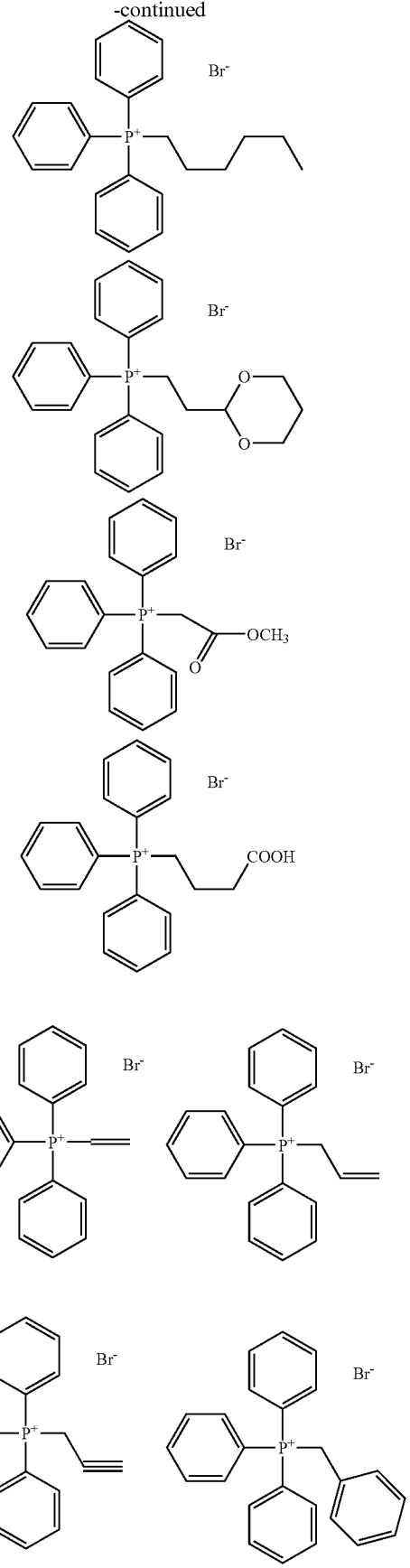

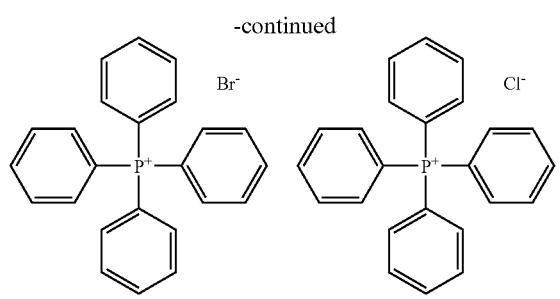

An amount of the phosphonium compound added to the protective layer is preferably from 0.01 to 20% by weight, more preferably from 0.05 to 10% by weight, and most preferably from 0.1 to 5% by weight, based on the solid content of the protective layer. In the case of adding the phosphonium compound to dampening water, the amount thereof is preferably from 0.001 to 5% by weight, more preferably from 0.005 to 1% by weight, and most preferably from 0.01 to 0.1% by weight.

The protective layer according to the second embodiment is described below with respect to other components than the phosphonium compound.

In the invention, the exposure is ordinarily conducted in the atmosphere, and the protective layer prevents invasion of a low molecular compound that hinders a image-forming reaction initiated by the image exposure in the image-recording layer, for example, oxygen or a basic substance present in the atmosphere thereby preventing the hindrance of the image-forming reaction by the exposure in the atmosphere. Accordingly, characteristics desired to the protective layer preferably include that it has good permeation of light used for exposure, that it is excellent in adhesion to the image-recording layer and that it can be easily removed by the on-machine developing step after exposure as well as it has low permeability of the low molecular compound, for example, oxygen. The protective layer having such characteristics has been heretofore variously studied and described in detail, for example, in U.S. Pat. No. 3,458,311 and JP-B-55-49729.

The material used for the protective layer includes, for example, a water-soluble polymer compound of relatively excellent crystallinity. Specifically, it includes a water-soluble polymer, for example, polyvinyl alcohol, polyvinyl pyrrolidone, acidic cellulose, gelatin, gum arabic and a polyacrylic acid. Among them, the use of polyvinyl alcohol EVA) as the main component provides the most preferred result for the basic characteristics, for example, oxygen blocking property and removability upon development. The polyvinyl alcohol may be partially substituted with ester, ether or acetal or partially have other copolymerization component as long as it contains unsubstituted vinyl alcohol units for providing the protective layer with the necessary oxygen blocking property and water solubility.

Preferred examples of the polyvinyl alcohol include those having a hydrolysis rate of from 71 to 100% by mole and a polymerization degree ranging from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 all produced by Kuraray Co., Ltd.

The component (for example, selection of PVA or use of additive) and the coating amount of the protective layer are appropriately selected in consideration of fog property, adhesion and scratch resistance as well as the oxygen blocking property and removability upon development. Ordinarily, as the hydrolysis rate of PVA is higher (that is, the content of unsubstituted vinyl alcohol unit present in the protective layer is higher) or as the thickness of the protective layer is larger, the oxygen blocking property is enhanced and it is preferred in view of the sensitivity. Further, for preventing occurrence of undesirable polymerization reaction during the production and preservation and preventing undesirable fog and thickening of image line at the image exposure, it is preferred that the oxygen permeability is not excessively high. Accordingly, the oxygen permeability A of the protective layer at 25° C. under one atmosphere is preferably as follows: $0.2<A<20$ ($mm^2 \cdot day$).

It is preferred to incorporate an inorganic stratiform compound described, for example, in JP-A-11-38633 into the protective layer according to the second embodiment of the invention. Preferable oxygen blocking property can be achieved by using the inorganic stratiform compound in combination with the above-described binder.

The inorganic stratiform compound used includes the inorganic stratiform compound prior to counter ionization with an organic cation, for example, the compound represented by formula (II) described hereinbefore.

With respect to the shape of the inorganic stratiform compound used in the invention, the thinner the thickness or the larger the plain size as long as smoothness of coated surface and transmission of active ray are not damaged, the better from the standpoint of control of diffusion. Therefore, an aspect ratio of the inorganic stratiform compound is ordinarily 20 or more, preferably 100 or more, and particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm, preferably from 0.5 to 10 μm, and particularly preferably from 1 to 5 μm. An average thickness of the particle is ordinarily 0.1 μm or less, preferably 0.05 μm or less, and particularly preferably 0.01 μm or less. For example, in the swellable synthetic mica that is the representative compound of the inorganic stratiform compounds, thickness is approximately from 1 to 50 nm and plain size is approximately from 1 to 20 μm.

By incorporating particles of the inorganic stratiform compound having such a large aspect ratio into the protective layer, strength of the coated layer increases and the penetration of oxygen or water cam be effectively inhibited, thereby preventing degradation of the protective layer due to deformation.

An amount of the inorganic stratiform compound contained in the protective layer is ordinarily from 5 to 55% by weight, preferably form 10 to 40% by weight, based on the total solid content of the protective layer. When the amount is less than 5% by weight, the effect of adhesion resistance is hardly obtained. When the amount exceeds 55% by weight, the layer formation is poor to cause decrease in sensitivity. When a plural kind of the inorganic stratiform compounds is used together, it is preferred that the total amount of the inorganic stratiform compounds is in the range described above.

As other composition for the protective layer, glycerine, dipropylene glycol, etc. can be added to the water-soluble polymer compound in an amount corresponding to several % by weight to impart flexibility. Further, an anionic surfactant, for example, sodium alkyl sulfate or sodium alkyl sulfonate; an amphoteric surfactant, for example, alkylamino carboxylic acid salt or alkylamino dicarboxylic acid salt; or a nonionic surfactant, for example, polyoxyethylene alkylphenyl ether can be added by several % by weight to the water-soluble polymer compound.

The thickness of the protective layer is suitably from 0.05 to 4 sun, and particularly preferably from 0.1 to 2.5 μm.

Further, the adhesion to the image-recording area, scratch resistance or the like of the protective layer are also extremely important in view of handling of the lithographic printing plate precursor. Specifically, when a protective layer, which is hydrophilic due to the incorporation of water-soluble polymer compound, is coated on the oleophilic image-recording layer, peeling of the protective layer is apt to occur because of the insufficiency of adhesion and it may sometimes result in defect, for example, defective hardening of the layer caused by polymerization inhibition due to oxygen.

Various proposals have been made for the purpose of improving the adhesion between the image-recording layer and the protective layer. For example, it is described in JP-A-49-70702 that sufficient adhesion can be obtained by mixing from 20 to 60% by weight of an acrylic emulsion, a water-insoluble vinyl pyrrolidone-vinyl acetate copolymer or the like in a hydrophilic polymer mainly comprising polyvinyl alcohol and coating the mixture on the image-recording layer. In the invention, any of such known techniques can be used. A coating method of the protective layer is described in detail, for example, in U.S. Pat. No. 3,458,311 and JP-B-55-49729.

Further, other functions can also be provided to the protective layer. For example, by adding a coloring agent (for example, a water-soluble dye), which is excellent in permeability for infrared ray used for the exposure and capable of efficiently absorbing light at other wavelengths, a safe light adaptability can be improved without decreasing the sensitivity.

(Image-Recording Layer)

Now, the image-recording layer of the lithographic printing plate precursor according to the invention is described in detail below.

The image-recording layer contains (A) an active ray absorbing agent, (B) a polymerization initiator and (C) a polymerizable compound, and is capable of being removed with printing ink dampening water or both of them.

Each of the components constituting the image-recording layer will be described in detail below.

<(A) Active Ray Absorbing Agent>

The active ray absorbing agent used in the invention is a compound which absorbs light emitted from a light source for the exposure and generates efficiently a radical from a polymerization initiator in a photon mode and/or a heat mode to contribute increase in the sensitivity of the lithographic printing plate precursor. As the active ray absorbing agent, in the case of imagewise exposing the lithographic printing plate precursor with an infrared laser, an infrared absorbing agent is preferably used, and in the case of imagewise exposing the lithographic printing plate precursor with an ultraviolet laser, a sensitizing dye absorbing light having a wavelength of 250 to 420 nm is preferably used.

(A1) Infrared Absorbing Agent

The infrared absorbing agent for use in the invention is a dye or pigment having an absorption maximum in a wavelength range of 760 to 1,200 nm.

As the dye, commercially available dyes and known dyes described in literatures, for example, Senryo Binran (Dye Handbook) compiled by The Society of Synthetic Organic Chemistry, Japan (1970) can be utilized. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes. Preferred examples of the dye include cyanine dyes described, for example, in JP-A-58-125246, JP-A-59-84356 and JP-A-60-78787; methine dyes described, for example, in JP-A-58-173696, JP-A-58-181690 and JP-A-58-194595; naphthoquinone dyes described, for example, in JP-A-58-112793, JP-A-58-224793, JP-A-59-48187, JP-A-59-73996, JP-A-60-52940 and JP-A-60-63744; squarylium dyes described, for example, in JP-A-58-112792; and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium comounds described in JP-B-5-13514 and JP-B-5-19702 are also preferably used. Other preferred examples of the dye include near infrared absorbing dyes represented by formulae (I) and (II) described in U.S. Pat. No. 4,756,993.

In particular, among the dyes, cyanine dyes, squarylium dyes, pyrylium dyes, nickel thiolate complexes and indolenine cyanine dyes are preferred. Cyanine dyes and indolenine cyanine dyes are more preferred. As a particularly preferred example of the dye, a cyanine dye represented by formula (i) shown below is exemplified.

Formula (i):

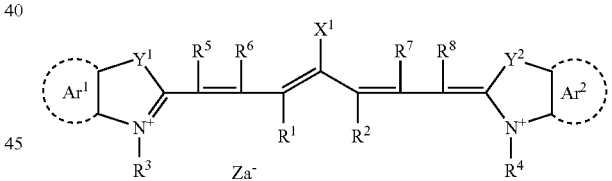

In formula (i), $X^1$ represents a hydrogen atom, a halogen atom, —$NPh_2$, $X^2$-$L^1$ or a group shown below:

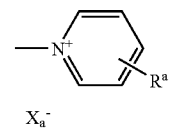

In the above, $X^2$ represents an oxygen atom, a nitrogen atom or a sulfur atom, and $L^1$ represents a hydrocarbon group having from 1 to 12 carbon atoms, an aromatic cyclic group containing a hetero atom or a hydrocarbon group having from 1 to 12 carbon atoms and containing a hetero atom. The hetero atom indicates a nitrogen atom, a sulfur atom, an oxygen atom, a halogen atom or a selenium atom. $Xa^-$ has the same meaning as $Za^-$ defined hereinafter, and $R^a$ represents a hydrogen atom or a substituent selected from an alkyl group, an aryl group, a substituted or unsubstituted amino group and a halogen atom Ph represents a phenyl group.

In formula (i), $R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms, and particularly preferably, $R^1$ and $R^2$ are combined with each other to form a 5-membered or 6-membered ring.

In formula (i), $Ar^1$ and $Ar^2$, which may be the same or different, each represents an aromatic hydrocarbon group which may have a substituent. Preferred examples of the aromatic hydrocarbon group include a benzene ring and a naphthalene ring. Also, preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent Preferred examples of the substituent include an alkoxy group having 12 or less carbon atoms, a carboxy group and a sulfo group. $R^5$, $R^6$, $R^7$ and $R^8$, which may be the same or different, each represents a hydrogen atom or a hydrocarbon group having 12 or less carbon atoms. From the standpoint of the availability of raw materials, a hydrogen atom is preferred. $Za^-$ represents a counter anion. However, $Za^-$ is not necessary when the cyanine dye represented by formula (i) has an anionic substituent in the structure thereof so that neutralization of charge is not needed. Preferred examples of the counter ion for $Za^-$ include a halogen ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of a coating solution for image-recording layer.

Specific examples of the cyanine dye represented by formula (i) which can be preferably used in the invention include those described in paragraphs [0017] to [0019] of JP-A-2001-133969.

Further, other particularly preferable examples include specific indolenine cyanine dyes described in JP-A-2002-278057.

Moreover, it is preferred that the infrared absorbing agent is water-soluble. However, when the infrared absorbing agent is water-insoluble, it can be incorporated by a method, for example, dispersion or dissolution in a mixed solvent.

Examples of the pigment used in the invention include commercially available pigments and pigments described in Colour Index (C.I.), *Saishin Ganryo Binran* (Handbook of Newest Pigments) compiled by Pigment Technology Society of Japan (1977), *Saishin Ganryo Oyou Gijutsu* (Newest Application Technologies of Pigments), CMC Publishing Co., Ltd. (1986) and *Insatsu Ink Gijutsu* Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of the pigment used include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after conducting the surface treatment. For the surface treatment, a method of coating a resin or wax on the pigment surface, a method of attaching a surfactant to the pigment surface and a method of bonding a reactive substance (for example, a silane coupling agent, an epoxy compound or polyisocyanate) to the pigment surface. The surface treatment methods are described in *Kinzoku Sekken no Seishitsu to Oyo* (Properties and Applications of Metal Soap), Saiwai Shobo, *Insatsu Ink Gijutsu* (Printing Ink Technology), CMC Publishing Co., Ltd. (1984), and *Saishin Ganryo Oyo Gijutsu* (Newest Application Technologies of Pigments), CMC Publishing Co., Ltd. (1986).

A particle size of the pigment is preferably in a range from 0.01 to 10 μm, more preferably in a range from 0.05 to 1 μm, particularly preferably in a range from 0.1 to 1 μm. In the above-described range, good stability of the pigment dispersion in a coating solution for image-recording layer and good uniformity of the image-recording layer can be obtained.

As a method for dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing methods are described in detail in *Saishin Ganryo Oyo Gijutsu* (Newest Application Technologies of Pigments), CMC Publishing Co., Ltd. (1986).

It is preferred to keep an amount of the infrared absorbing agent added to the image-recording layer to the minimum necessary in order to prevent a side effect of inhibiting the polymerization reaction.

The infrared absorbing agent can be added in an amount ordinarily from 0.001 to 50% by weight, preferably from 0.005 to 30% by weight, particularly preferably from 0.01 to 10% by weight, based on the total solid content of the image-recording layer. In the above-described range, the high sensitivity can be achieved without adverse affects on the uniformity of the image-recording layer and the strength of layer.

Of the infrared absorbing agents described above, the cyanine dye represented by formula (i) is preferably used.

(A2) Sensitizing Dye

The sensitizing dye for use in the invention is a compound having absorption in a wavelength range of 250 to 420 nm. Specific examples of the sensitizing dye include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-tert-butyl-9,10-anthraquinone, 2,6-dichloro-9,10-anthraquinone, xantone, 2-imethylxantone, 2-methoxyxantone, thioxantone, benzyl, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone and benzanthrone.

Further, preferred examples of the sensitizing dye used in the invention include a compound represented by formula (ii) described in JP-B-51-48516.

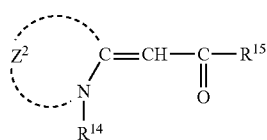
(ii)

In the formula, $R^{14}$ represents an alkyl group (for example, a methyl group, an ethyl group or a propyl group) or a substituted alkyl group (for example, a 2-hydroxyethyl group, a 2-methoxyethyl group, a carboxymethyl group or a 2-carboxyethyl group). $R^{15}$ represents an alkyl group (for example, a methyl group or an ethyl group) or an aryl group (for example, a phenyl group, a p-hydroxyphenyl group, a naphthyl group or a thienyl group).

$Z^2$ represents a nonmetallic atomic group necessary for forming a nitrogen-containing heterocyclic nucleus conventionally used in a cyanine dye, for example, a benzothiazole (e.g., benzothiazole, 5-chlorobenzothiazole or 6-chlorobenzothiazole), a naphthothiazole (e.g., α-naphthothiazole or β-naphthothiazole), a benzoselenazole (e.g., benzoselenazole, 5-chlorobenzoselenazole or 6-methoxybenzoselenazole), a naphthoselenazole (e.g., α-naphthoselenazole or β-naphthoselenazole), a benzoxazole (e.g., benzoxazole, 5-methylbenzoxazole or 5-phenylbenzoxazole) or a naphthoxazole (e.g., α-naphthoxazole or β-naphthoxazole).

Specific examples of the compound represented by formula (ii) include compounds having a chemical structure of a combination of $Z^2$, $R^{14}$ and $R^{15}$, and many compounds are present as known substances. Thus, the compound used can be appropriately selected from known substances. Moreover, preferred examples of the sensitizing dye used in the invention include merocyanine dyes described in JP-B-5-47095 and a ketocoumalin compound represented by the following formula (iii):

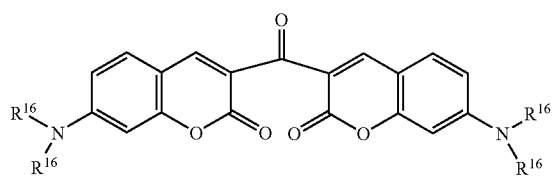
(iii)

wherein $R^{16}$ represents an alkyl group, for example, a methyl group or an ethyl group.

Further, merocyanine dyes described in JP-A-2000-147763 are also used as the sensitizing dye. Moreover, sensitizing dyes described in JP-A-2001-100412 are also preferable. Specifically, compounds shown below are exemplified.

D-1
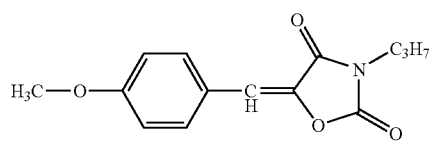

D-2
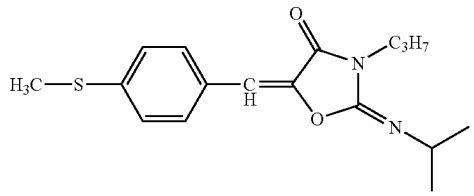

D-3
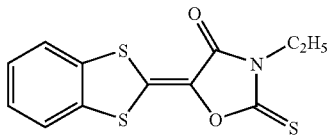

D-4
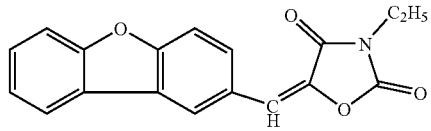

D-5
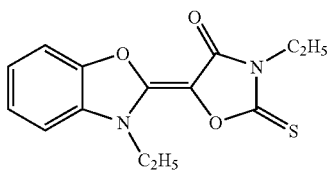

D-6
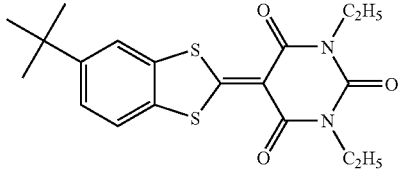

D-7
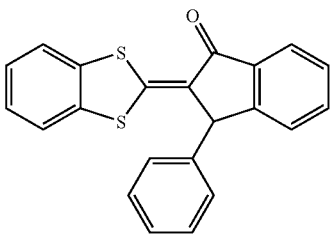

D-8
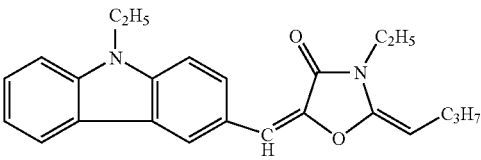

D-9
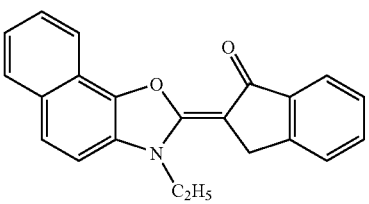

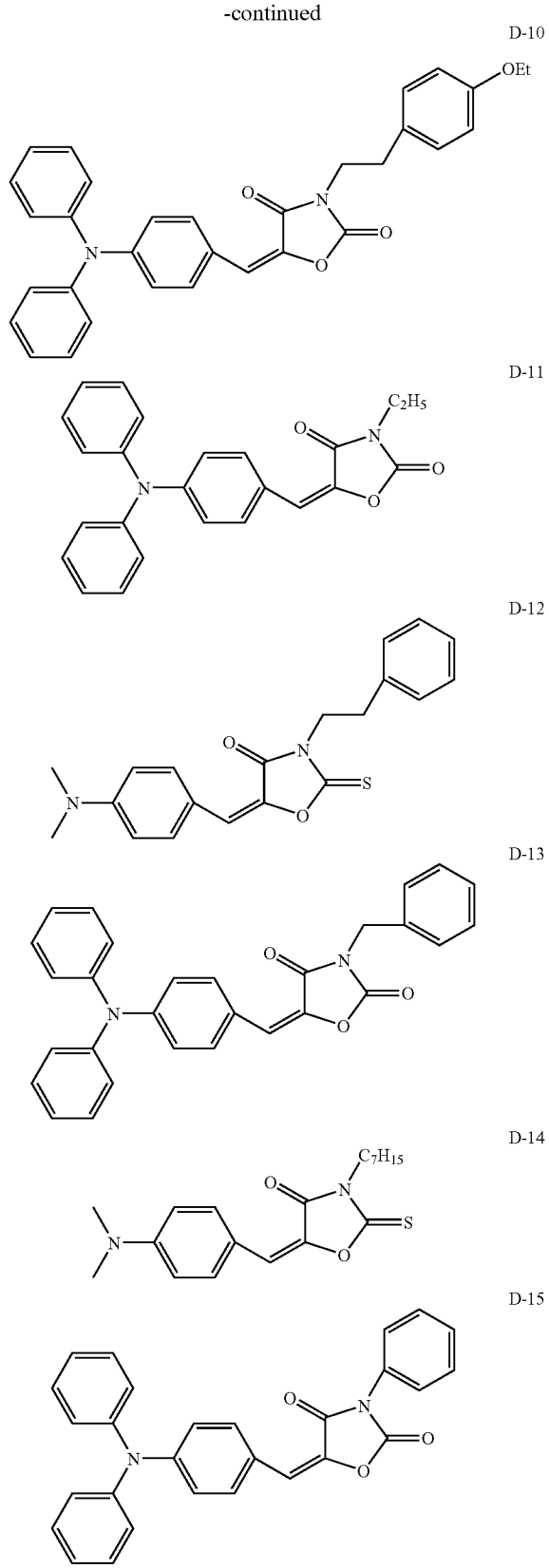

The sensitizing dye can be added in an amount preferably from 0.1 to 50% by weight, more preferably from 0.5 to 300% by weight, particularly preferably from 0.8 to 20% by weight, based on the total solid content of the image-recording layer.

<(B) Polymerization Initiator>

The polymerization initiator which can be used in the invention is a compound (radical polymerization initiator) that generates a radical upon light, heat or both energies to initiate or accelerate polymerization of a compound having a polymerizable unsaturated group. The polymerization initiator for use in the invention includes known thermal polymerization initiators, compounds containing a bond having a small bond dissociation energy and photopolymerization initiators.

Examples of the polymerization initiator include organic halogen compounds, carbonyl compounds, organic peroxides, azo compounds, azido compounds, metallocene compounds, hexaarylbiimidazole compounds, organic boron compounds, disulfone compounds, oximester compounds, oximether compounds and onium salt compounds.

The organic halogen compounds described above specifically include, for example, compounds described in Wakabayashi et al., *Bull. Chem. Soc. Japan*, 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry*, 1, No. 3 (1970). Among them, oxazole compounds and s-triazine compounds each substituted with a trihalomethyl group are preferable.

More preferably, s-triazine derivatives in which at least one mono-, di- or tri-halogen substituted methyl group is connected to the s-triazine ring are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2-[4-(p-hydroxybenzoylamino)phenyl]-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1-trichloromethyl-(p-butylphenyl)ketone, thioxantone derivatives, e.g., thioxantone, 2-ethylthioxantone, 2-isopropylthioxantone, 2-chlorothioxantone, 2,4-dimetylthioxantone, 2,4-dietylthioxantone or 2,4-diisopropylthioxantone, and benzoic acid ester derivatives, e.g., ethyl p-dimethylaminobenzoate or ethyl p-diethylaminobenzoate.

The azo compounds described above include, for example, azo compounds described in JP-A-8-108621.

The organic peroxides described above include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tertiary carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-triafluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-triafluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl or bis(cyclopentadienyl)-bis(2,6-difluoro-3-(pyl-1-yl)phenyl) titanium and iron-arene complexes described in JP-A-1-304453 and JP-A-1-152109.

The hexaarylbiimidazole compounds described above include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The organic boron compounds described above include, for example, organic boric acid salts described in JP-A-62-143044, JP-A-62-150242, JP-A-9-188685, JP-A-9-188686, JP-A-9-188710, JP-A-2000-131837, JP-A-2002-107916, Japanese Patent No. 2764769, JP-A-2002-116539 and Martin Kunz, *Rad Tech '98, Proceeding*, Apr. 10-22, 1998, Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds described above include, for example, compounds described in JP-A-61-166544 and JP-A-2003-328465.

The oximester compounds described above include, for example, compounds described in *J. C. S. Perkin II*, 1653-1660 (1979), *J. C. S. Perkin II*, 156-162 (1979), *Journal of Photopolymer Science and Technology*, 202-232 (1995) and JP-A-2000-66385, and compounds described in JP-A-2000-80068, and specifically, compounds represented by the following formulae:

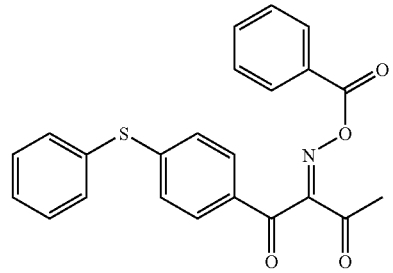

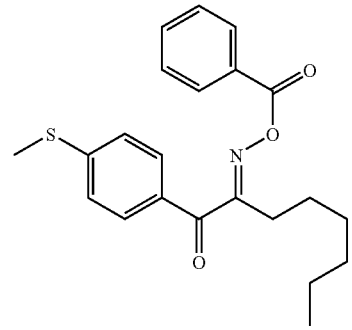

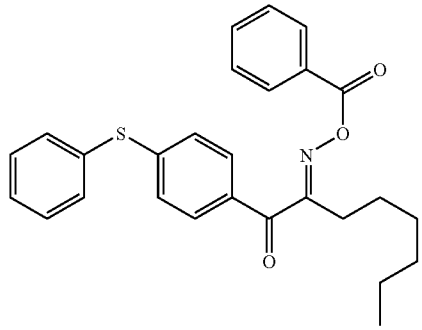

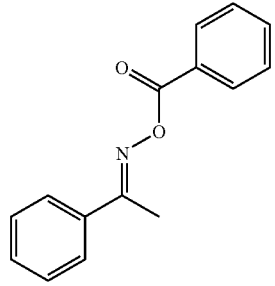

-continued
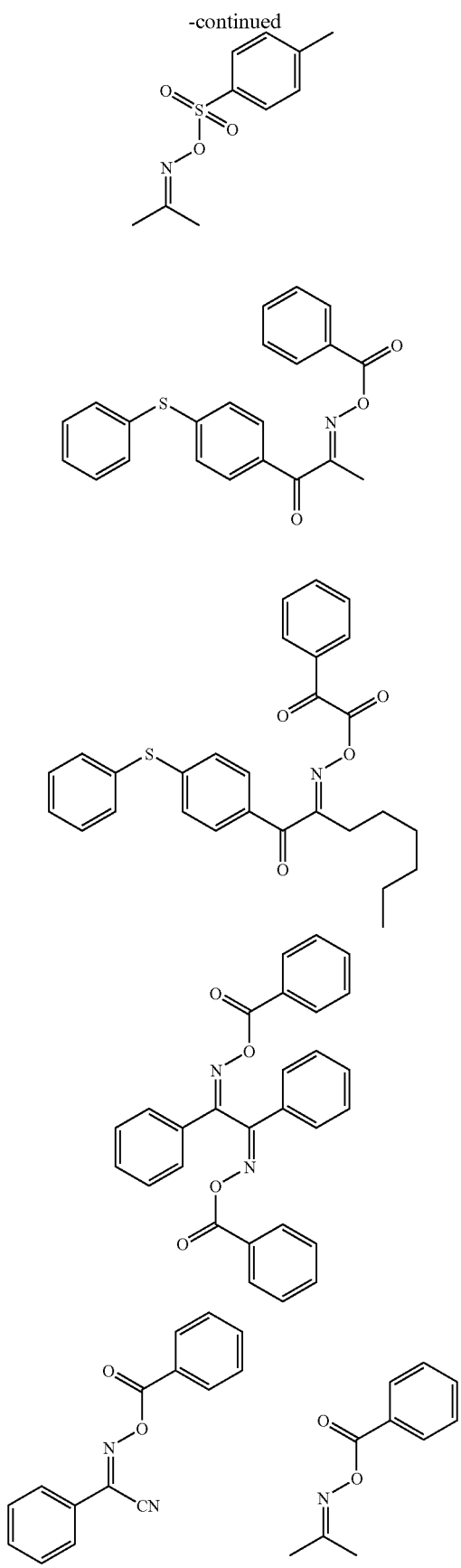
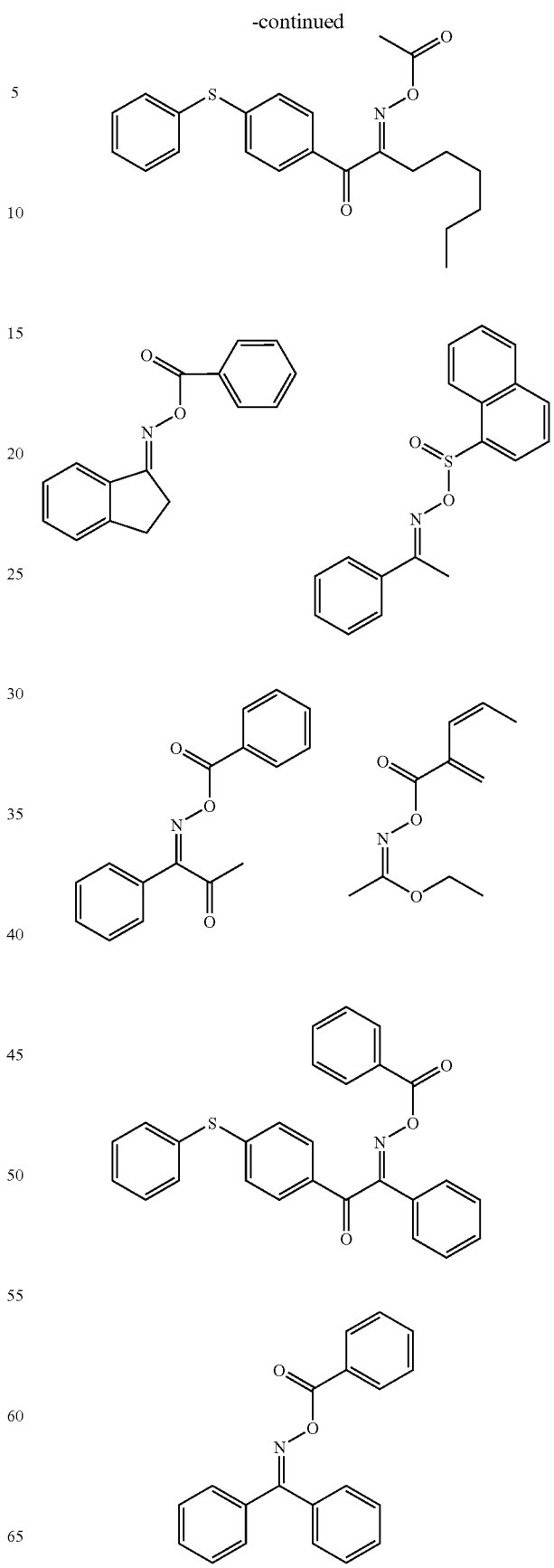

-continued

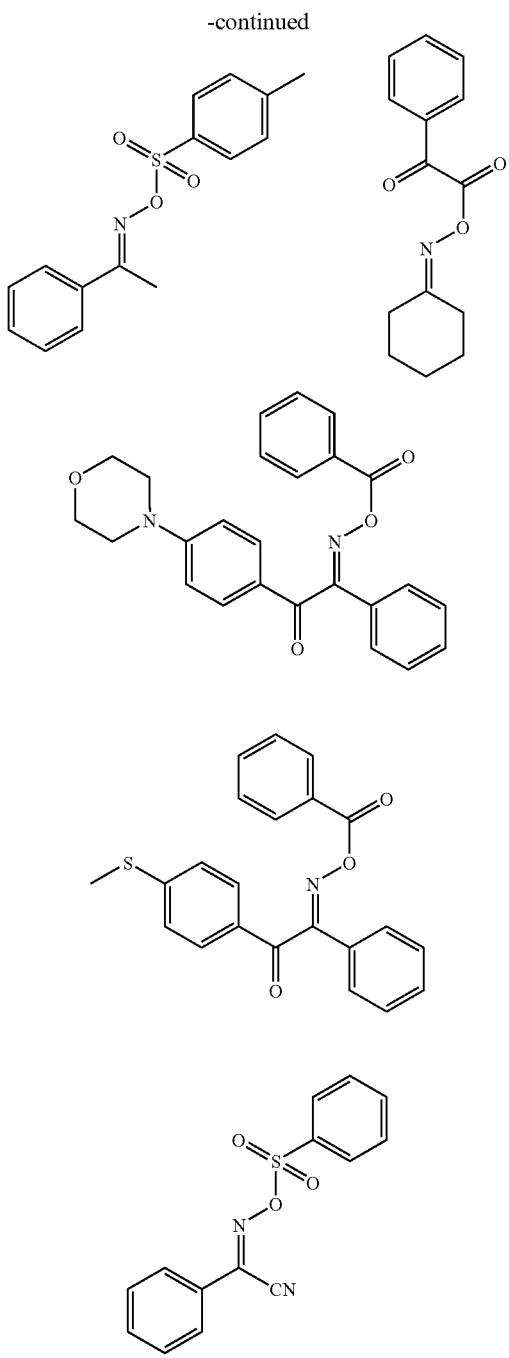

The oximether compounds described above include, for example, compounds described in JP-A-8-202035 and JP-A-10-237118. Specific examples thereof include compounds represented by the following formulae:

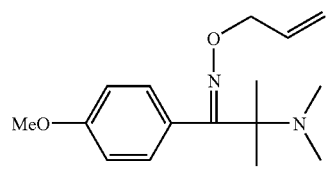

-continued

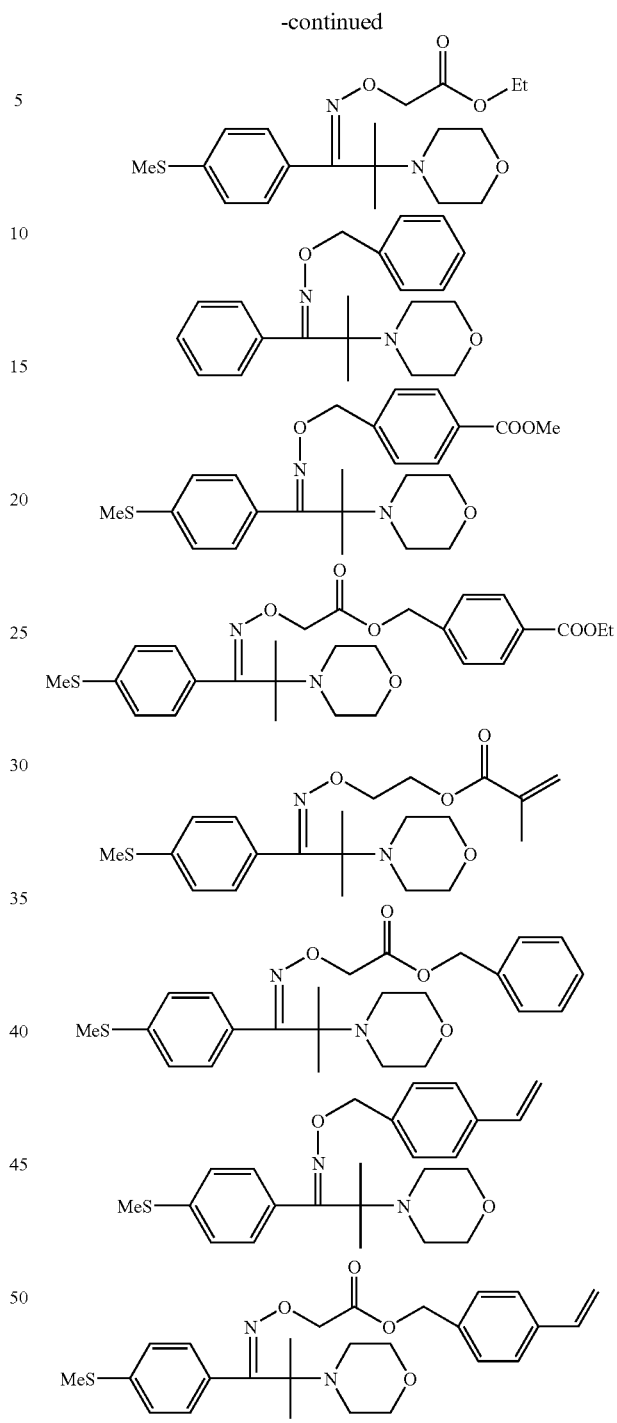

The onium salt compounds described above include, for example, diazonium salts described in S. I. Schlesinger, *Photogr. Sci. Eng.*, 18, 387 (1974) and T. S. Bal et al., *Polymer*, 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833, 827 and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci. Polymer Chem. Ed.*, 17, 1047 (1979), and arsonium salts described in C. S. Wen et al., *Teh Proc. Conf. Rad. Curing ASIA*, p. 478, Tokyo, Oct. (1988).

From the standpoint of the reactivity and stability, the above-described oximester compounds and onium salt compounds (diazonium salts, iodonium salts and sulfonium salts) are particularly preferably exemplified. In the invention, the onium salt compound functions not as an acid generator, but as an ionic radical polymerization initiator.

The onium salt compounds preferably used in the invention include onium salts represented by the following formulae (RI-I) to (RI-III):

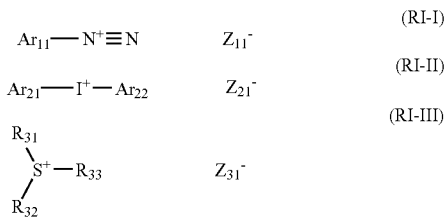

(RI-I)
(RI-II)
(RI-III)

In formula (RI-I), $Ar_{11}$ represents an aryl group having 20 or less carbon atoms, which may have 1 to 6 substituents. Preferred example of the substituent includes an alkyl group having from 1 to 12 carbon atoms, an alkenyl group having from 2 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylimino group having from 2 to 12 carbon atoms, an alkylamido group or arylamido group having from 2 to 12 carbon atoms, a carbonyl group, a carboxy group, a cyano group, a sulfonyl group, an thioalkyl group having from 1 to 12 carbon atoms and an thioaryl group having from 6 to 12 carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion and a sulfate ion. Among them, the perchlorate ion, hexafluorophosphate ion, tetrafluoroborate ion, sulfonate ion and sulfinate ion are preferred in view of the stability.

In the formula (RI-II), $Ar_{21}$ and $Ar_{22}$ each independently represents an aryl group having 20 or less carbon atoms, which may have 1 to 6 substituents. Preferred example of the substituent includes an alkyl group having from 1 to 12 carbon atoms, an alkenyl group having from 2 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylimino group having from 2 to 12 carbon atoms, an alkylamido group or arylamido group having from 2 to 12 carbon atoms, a carbonyl group, a carboxy group, a cyano group, a sulfonyl group, an thioalkyl group having from 1 to 12 carbon atoms and an thioaryl group having from 6 to 12 carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, the perchlorate ion, hexafluorophosphate ion, tetrafluoroborate ion, sulfonate ion, sulfinate ion and carboxylate ion are preferred in view of the stability and reactivity.

In the formula (RI-III), $R_{31}$, $R_{32}$ and $R_{33}$ each independently represents an aryl group, alkyl group, alkenyl group or alkynyl group having 20 or less carbon atoms, which may have 1 to 6 substituents. Among them, the alkyl group is preferred in view of the reactivity and stability. Preferred example of the substituent includes an alkyl group having from 1 to 12 carbon atoms, an alkenyl group having from 2 to 12 carbon atoms, an alkynyl group having from 2 to 12 carbon atoms, an aryl group having from 6 to 12 carbon atoms, an alkoxy group having from 1 to 12 carbon atoms, an aryloxy group having from 6 to 12 carbon atoms, a halogen atom, an alkylamino group having from 1 to 12 carbon atoms, a dialkylimino group having from 2 to 12 carbon atoms, an alkylamido group or arylamido group having from 2 to 12 carbon atoms, a carbonyl group, a carboxy group, a cyano group, a sulfonyl group, an thioalkyl group having from 1 to 12 carbon atoms and an thioaryl group having from 6 to 12 carbon atoms. $Z_{31}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion and a sulfate ion. Among them, the perchlorate ion, hexafluorophosphate ion, tetrafluoroborate ion, sulfonate ion, sulfinate ion and carboxylate ion are preferred in view of the stability and reactivity. As the anion, carboxylate ions described in JP-A-2001-343742 are more preferably exemplified, and carboxylate ions described in JP-A-2002-148790 are particularly preferably exemplified.

Specific examples of the onium salt compound preferably used in the invention are set forth below, but the invention should not be construed as being limited thereto.

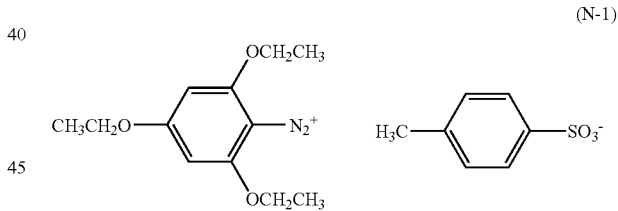
(N-1)
(N-2)
(N-3)
(N-4)
(N-5)
(N-6)

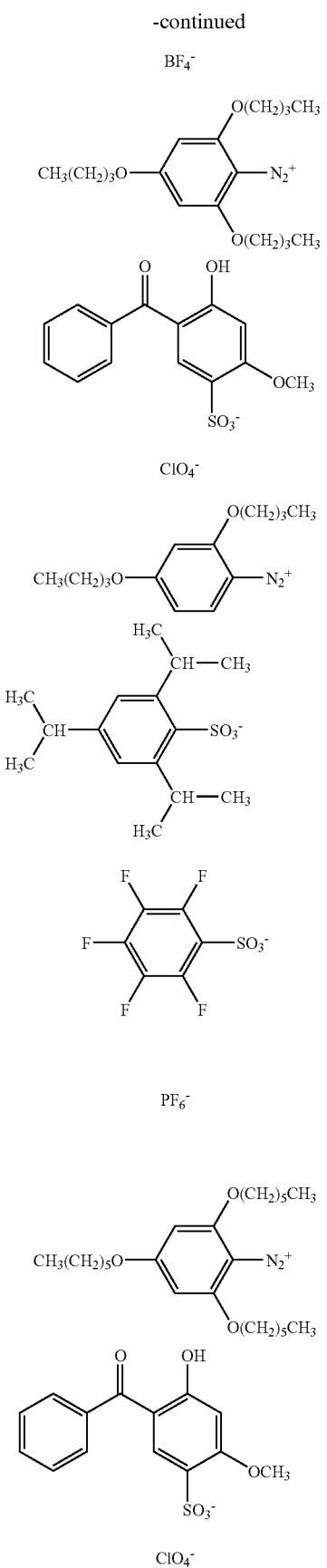
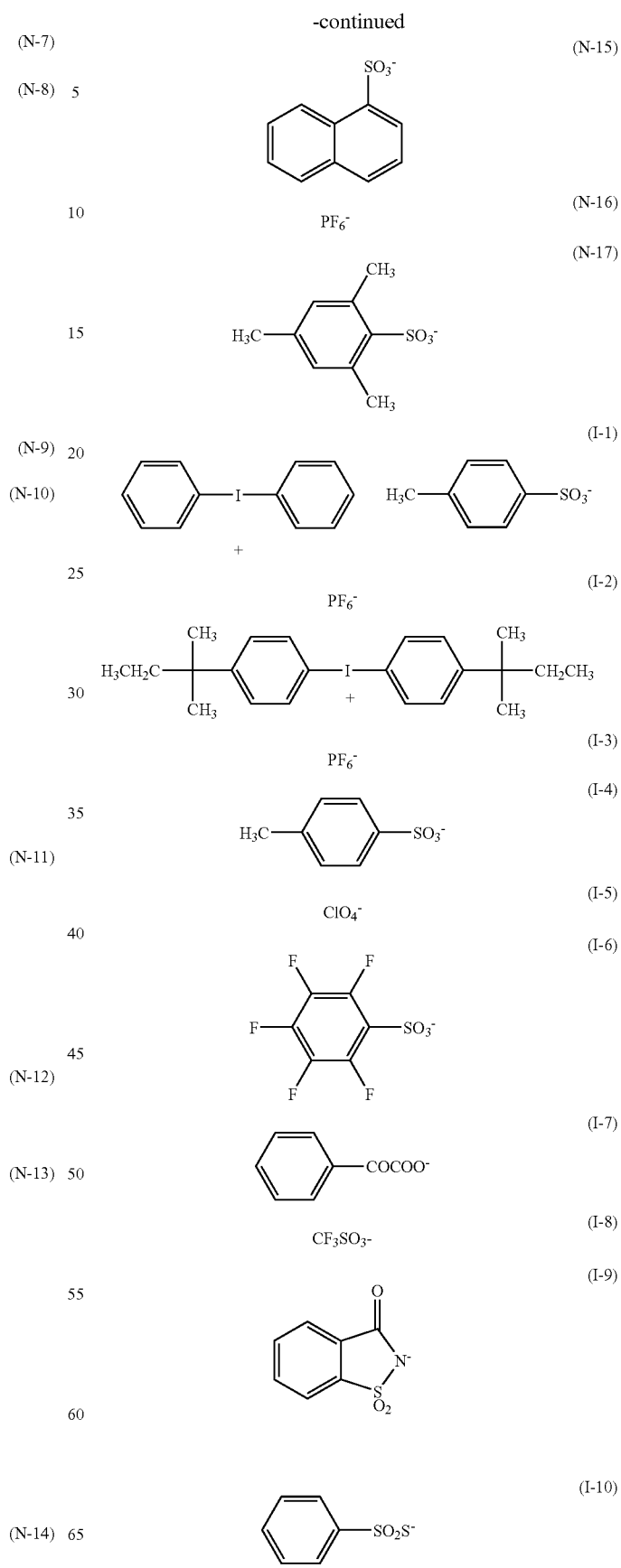

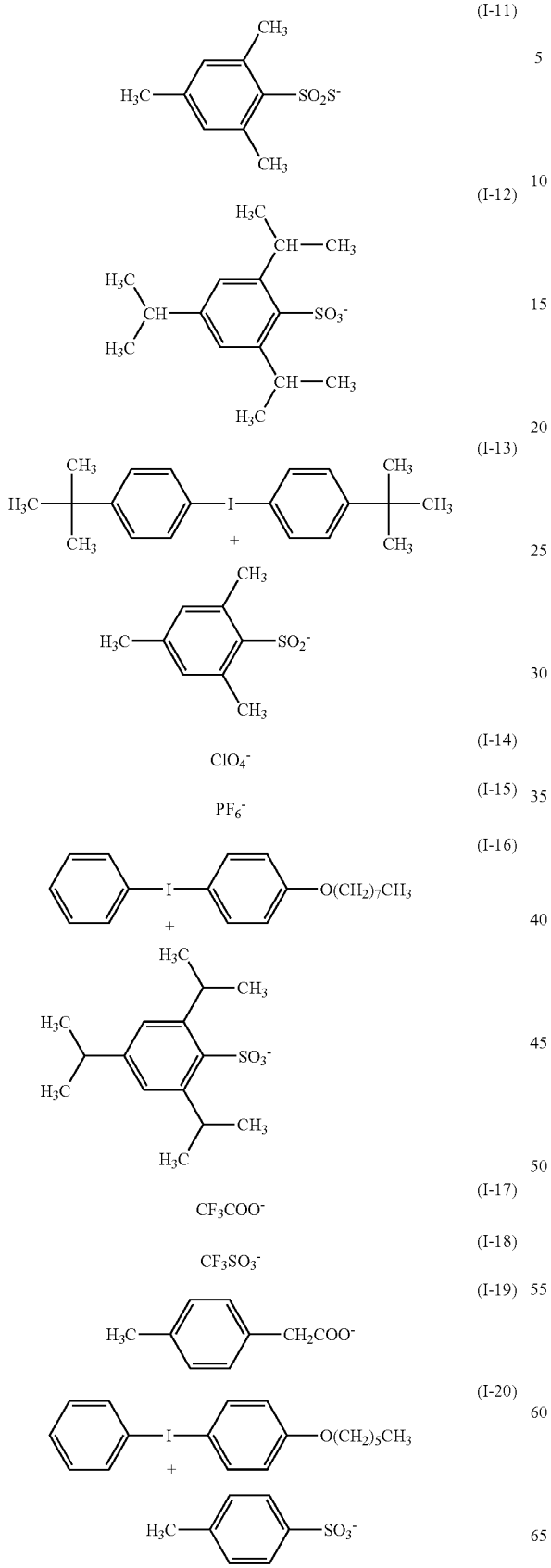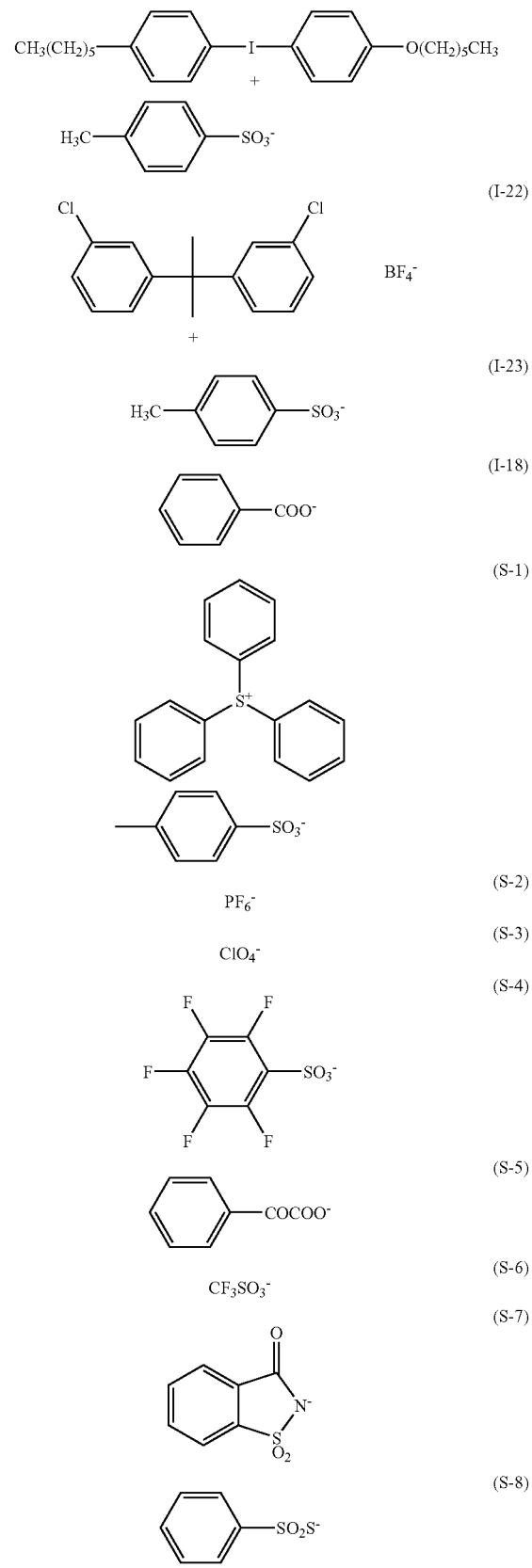

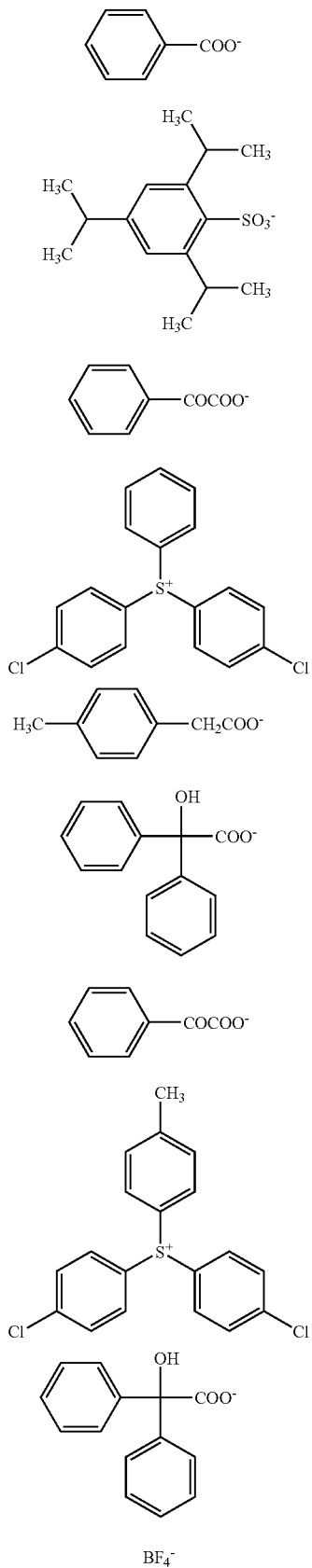

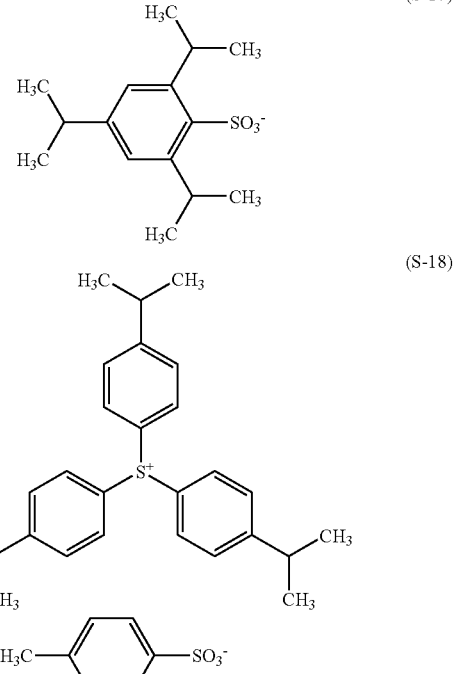

The polymerization initiator for use in the invention has preferably an absorption maximum wavelength of 400 nm or shorter, more preferably 360 nm or shorter, and most preferably 300 nm or shorter. Since the polymerization initiator has the absorption wavelength in an ultraviolet region as above, white light safety of the lithographic printing plate precursor is increased.

The polymerization initiator can be added preferably in an amount from 0.1 to 50% by weight, more preferably from 0.5 to 30% by weight, particularly preferably from 1 to 20% by weight, based on the total solid content of the image-recording layer. In the above-described range, preferable sensitivity and good stain resistance in the non-image area at the time of printing are achieved. The polymerization initiators may be used individually or in combination of two or more thereof. Further, the polymerization initiator may be added together with other components to one layer or may be added to a different layer separately provided.

<(C) Polymerizable Compound>

The polymerizable compound used in the image-recording layer according to the invention is an addition-polymerizable compound having at least one ethylenically unsaturated double bond and it is selected from compounds having at least one, preferably two or more, terminal ethylenically unsaturated double bonds. Such compounds are broadly known in the field of art and they can be used in the invention without any particular limitation. The compound has a chemical form, for example, a monomer, a prepolymer, specifically, a dimer, a trimer or an oligomer, or a copolymer thereof or a mixture thereof. Examples of the monomer and copolymer thereof include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Furthermore, an addition reaction product of an unsaturated carboxylic acid ester or amide having an electrophilic substituent, for example, an isocyanato group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide (EO) modified triacrylate, polyester acrylate oligomer or isocyanuric acid EO modified triacrylate; methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane; itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; crotonic acid esters, for example, ethylene glycol dicrotonate, tetramethylene glycol dicrotonate, pentaerythritol dicrotonate or sorbitol tetradicrotonate; isocrotonic acid esters, for example, ethylene glycol diisocrotonate, pentaerythritol diisocrotonate or sorbitol tetraisocrotonate; and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \qquad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Furthermore, a photopolymerizable composition having remarkably excellent photosensitive speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth) acrylic acid, described in JP-A-48-183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use, or an amount added, can be appropriately arranged depending on the characteristic design of the final lithographic printing plate precursor. For instance, the compound is selected from the following standpoints.

In view of the sensitivity, a structure having a large content of unsaturated groups per molecule is preferred and in many cases, a bifunctional or more functional compound is preferred. In order to increase the strength of image area, that is, hardened layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the image-recording layer. For instance, the compatibility may be improved in some cases by using the compound of low purity or using two or more kinds of the compounds in combination. A specific structure may be selected for the purpose of improving an adhesion property to a support or a protective layer described hereinafter.

The polymerizable compound is preferably used in an amount from 5 to 80% by weight, more preferably from 25 to 75% by weight, based on the total solid content of the image-recording layer. The polymerizable compounds may be used individually or in combination of two or more thereof. In the method of using the polymerizable compound, the structure, blend and amount added can be appropriately selected by taking account of the extent of polymerization inhibition due to oxygen, resolution, fogging property, change in refractive index, surface adhesion and the like. Further, depending on the case, a layer construction, for example, an undercoat layer or an overcoat layer, and a coating method, may also be considered.

<(D) Binder Polymer>

In the invention, a binder polymer can bee used in order to improve the film characteristic and on-machine developing property of the image-recording layer. As the binder polymers, those heretofore known can be used without restriction, and linear organic polymers having a film forming property are preferred. Examples of the binder polymer include acrylic resins, polyvinyl acetal resins, polyurethane resins, polyurea resins, polyimide resins, polyamide resins, epoxy resins, methacrylic resins, polystyrene resins, novolac type phenolic resins, polyester resins, synthesis rubbers and natural rubbers.

Preferred examples of the binder polymer include (meth) acrylic resins, specifically, polymers of (meth)acrylate. Among them, copolymers between an alkyl(meth)acrylate and a monomer of (meth)acrylate having a —COOR group wherein R includes a —CH$_2$CH$_2$O— structure are more preferable. Specific examples thereof are set forth below, but the invention should not be construed as being limited thereto.

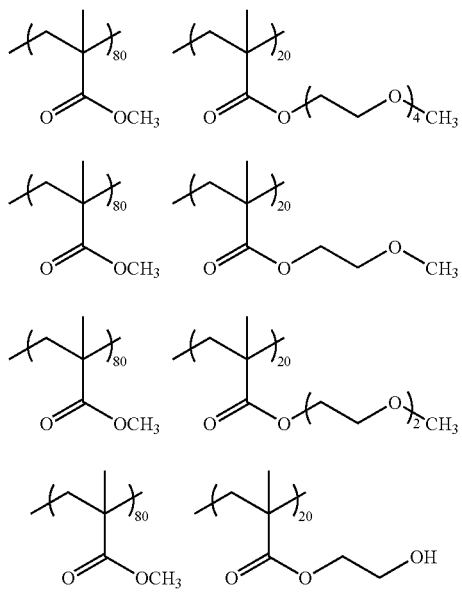

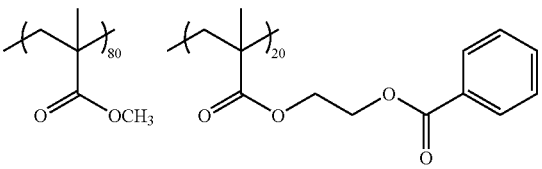

The binder polymer preferably has a crosslinkable property in order to improve the film strength of the image area. In order to impart the crosslinkable property to the binder polymer, a crosslinkable functional group, for example, an ethylenically unsaturated bond is introduced into a main chain or side chain of the polymer. The crosslinkable functional group may be introduced by copolymerization or a polymer reaction.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amide residue (R in —COOR or —CONHR) has an ethylenically unsaturated bond.

Examples of the residue (R described above) having an ethylenically unsaturated bond include —(CH$_2$)$_n$CR$^1$=CR$^2$R$^2$, —(CH$_2$O)$_n$CH$_2$CR$^1$=CR$^2$R$^3$, —(CH$_2$CH$_2$O)$_n$CH$_2$CR$^1$=CR$^2$R$^3$, —(CH$_2$)$_n$NH—CO—O—CH$_2$CR$^1$=CR$^2$R$^1$, —(CH$_2$)$_n$—O—CO—CR$^1$=CR$^2$R$^3$ and —(CH$_2$CH$_2$O)$_2$—X (wherein R$^1$ to R$^3$ each represents a hydrogen atom, a halogen atom or an alkyl group having from 1 to 20 carbon atoms, an aryl group, alkoxy group or aryloxy group, or R$^1$ and R$^2$ or R$^1$ and R$^3$ may be combined with each other to form a ring. n represents an integer of 1 to 10. X represents a dicyclopentadienyl residue).

Specific examples of the ester residue include —CH$_2$CH=CH$_2$, —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$OCOC(CH$_3$)=CH$_2$, —CH$_2$CH$_2$OCOCH=CH$_2$, —CH$_2$CH$_2$—NH-COO—CH$_2$CH=CH$_2$ and —CH$_2$CH$_2$O—X (wherein X represents a dicyclopentadienyl residue).

Specific examples of the amide residue include —CH$_2$CH=CH$_2$, —CH$_2$CH$_2$—Y (wherein Y represents a cyclohexene residue) and —CH$_2$CH$_2$—OCO—CH=CH$_2$.

The binder polymer having crosslinkable property is hardened, for example, by adding a free radical (a polymerization initiating radical or a growing radical of a polymerizable compound during polymerization) to the crosslinking functional group of the polymer and undergoing addition polymerization between the polymers directly or through a polymerization chain of the polymerizable compound to form crosslinkage between the polymer molecules. Alternately, it is hardened by generation of a polymer radical upon extraction of an atom in the polymer (for example, a hydrogen atom on a carbon atom adjacent to the functional crosslinking group) by a free radical and connecting the polymer radicals with each other to form cross-linkage between the polymer molecules.

A content of the crosslinkable group in the binder polymer (content of the radical polymerizable unsaturated double bond determined by iodine titration) is preferably from 0.1 to 10.0 mmol) more preferably from 1.0 to 7.0 mmol and most preferably from 2.0 to 5.5 mmol, based on 1 g of the binder polymer. In the above-described range, preferable sensitivity and good preservation stability can be obtained.

From the standpoint of improvement in the on-machine developing property of the unexposed area in the image-recording layer, it is preferred that the binder polymer has high solubility or dispersibility in ink and/or dampening water.

In order to improve the solubility or dispersibility in the ink, the binder polymer is preferably oleophilic and in order to improve the solubility or dispersibility in the dampening water, the binder polymer is preferably hydrophilic. Therefore, it is effective in the invention that an oleophilic binder polymer and a hydrophilic binder polymer are used in combination.

The hydrophilic binder polymer preferably includes, for example, a polymer having a hydrophilic group, for example, a hydroxy group, a carboxy group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group or a phosphoric acid group.

Specific examples thereof include gum arabic, casein, gelatin, a starch derivative, carboxy methyl cellulose and a sodium salt thereof cellulose acetate, sodium alginate, vinyl acetate-maleic acid copolymer, styrene-maleic acid copolymer, polyacrylic acid and a salt thereof, polymethacrylic acid and a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, a polyethylene glycol, a hydroxypropylene polymer, a polyvinyl alcohol, a hydrolyzed polyvinyl acetate having a hydrolysis degree of 60% by mole or more, preferably 80% by mole or more, a polyvinyl formal, a polyvinyl butyral, a polyvinyl pyrrolidone, a homopolymer or copolymer of acrylamide, a homopolymer or polymer of methacrylamide, a homopolymer or copolymer of N-methylolacrylamide, a polyvinyl pyrrolidone, an alcohol-soluble nylon, a polyether of 2,2-bis-(4-hydroxyphenyl)propane and epichlorohydrin.

A weight average molecular weight of the binder polymer is preferably 5,000 or more, more preferably from 10,000 to 300,000. A number average molecular weight of the binder polymer is preferably 1,000 or more, more preferably from 2,000 to 250,000. The polydispersity (weight average molecular weight/number average molecular weight) thereof is preferably from 1.1 to 10.

The binder polymer may be any of a random polymer, a block polymer, a graft polymer and the like, and preferably a random polymer.

The binder polymer can be synthesized by a conventionally known method. The binder polymer having a crosslinkable group in the side chain can be easily synthesized by radical polymerization or a polymer reaction.

The binder polymers may be used individually or as a mixture of two or more thereof.

A content of the binder polymer is preferably from 10 to 90% by weight, more preferably from 20 to 80% by weight, based on the total solid content of the image-recording layer. In the above-described range, good strength of the image area and image-forming property can be obtained.

A weight ratio of the polymerizable compound to the binder polymer used is preferably from 1/9 to 7/3.

<(E) Phosphonium Compound>

The second embodiment of the invention is characterized by incorporating the phosphonium compound into the image-recording layer and/or protective layer. The phosphonium compound used in the image-recording layer of the second embodiment is the compound represented by formula (I) described above. Specific examples thereof also include those described above. The phosphonium compound has a function of stabilizing ink-receptive property in the image area without degradation of the on-machine developing property.

An amount of the phosphonium compound added to the image-recording layer according to the second embodiment is preferably from 0.01 to 20% by weight, more preferably from 0.05 to 10% by weight, and most preferably from 0.1 to 5% by weight, based on the solid content of the image-recording layer. In the case of adding the phosphonium compound to dampening water, the amount thereof is preferably from 0.001 to 5% by weight, more preferably from 0.005 to 1% by weight, and most preferably from 0.01 to 0.1% by weight.

<(F) Other Components of Image-Recording Layer>

Into the image-recording layer according to the invention, there may be incorporated components other than those described above, for example, a surfactant, a coloring agent, a print-out agent, a polymerization inhibitor (thermal polymerization inhibitor), a higher fatty acid derivative, a plasticizer, an organic fine particle or a low molecular weight hydrophilic compound.

In the invention, it is preferred to use a surfactant in the image-recording layer in order to promote the on-machine developing property at the start of printing and to improve the state of coated surface. The surfactant includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and those hitherto known can be used. Examples of the nonionic surfactant include polyoxyethylene alkyl ethers, polyoxyethylene alkylphenylethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and those hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and those hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and those hitherto known can be used. Examples of the amphoteric surfactant include carboxybetaines, aminocarboxylic acids, sulfobetaines, aminosulfuric esters, and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferred surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants may be used individually or in combination of two or more thereof.

A content of the surfactant is preferably from 0.001 to 10% by weight, more preferably from 0.01 to 5% by weight, based on the total solid content of the image-recording layer.

In the image-recording layer according to the invention, a dye having a large absorption in the visible region can be used as a coloring agent of the image formed. Specifically, the dye includes Oil yellow #101, Oil yellow #103, Oil pink #312, Oil green BG, Oil blue BOS, Oil blue #603, Oil black BY, Oil black BS, Oil black T-505 (manufactured by Orient Chemical Industries, Ltd.), Victoria pure blue, Crystal violet (CI42555), Methyl violet (CI42535), Ethyl violet, Rhodamine B (CI45170B), Malachite green (CI42000), Methylene blue (CI52015) and dyes described in JP-A-62-293247. Further, a pigment, for example, a phthalocyanine pigment, an azo pigment, carbon black or titanium oxide can also preferably be used.

It is preferred to add the coloring agent since distinction between the image area and the non-image area is easily conducted after the formation of image. An amount of the coloring agent added is preferably from 0.01 to 10% by weight based on the total solid content of the image-recording layer.

To the image-recording layer according to the invention, a compound causing discoloration by an acid or a radical can be added in order to form a print-out image. As such a compound, various kinds of dyes, for example, dyes of diphenylmethane type, triphenylmethane type, triazine type, oxazine type, xanthene type, anthraquinone type, iminoquinone type, azo type and azomethine type are effectively used.

Specific examples thereof include dyes, for example, Brilliant green, Ethyl violet, Methyl green, Crystal violet, basic Fuchsine, Methyl violet 2B, Quinaldine red, Rose Bengal, Methanyl yellow, Thimol sulfophthalein, Xylenol blue, Methyl orange, Paramethyl red, Congo red, Benzo purpurin 4B, α-Naphthyl red, Nile blue 2B, Nile blue A, Methyl violet, Malachite green, Parafuchsine, Victoria pure blue BOH (produced by Hodogaya Chemical Co., Ltd.), Oil blue #603 (produced by Orient Chemical Industries, Ltd.), Oil pink #312 (produced by Orient Chemical Industries, Ltd.), Oil red 5B (produced by Orient Chemical Industries, Ltd.), Oil scarlet #308 (produced by Orient Chemical Industries, Ltd.), Oil red OG (produced by Orient Chemical Industries, Ltd.), Oil red RR (produced by Orient Chemical Industries, Ltd.), Oil green #502 (produced by Orient Chemical Industries, Ltd.), Spiron Red BEH special (produced by Hodogaya Chemical Co., Ltd.), m-Cresol purple, Cresol red, Rhodamine B, rhodamine 6G, Sulfo rhodamine B, Auramine, 4-p-diethylaminophenyliminonaphthoquione, 2-carboxyanilino-4-p-diethylaminophenyliminonaphthoquinone, 2-carboxystearylamino-4-p-N,N-bis(hydroxyethyl) aminophenyliminonaphthoquinone, 1-phenyl-3-methyl-4-p-diethylaminophenylimino-5-pyrazolon or 1-β-naphtyl-4-p-diethylaminophenylimino-5-pyrazolon, and a leuco dye, for example, p,p',p"-hexamethyltriaminotriphenylmethane (leuco crystal violet) or Pergascript Blue SRB (produced by Ciba Geigy Ltd.).

In addition to those described above, a leuco dye known as a material for heat-sensitive paper or pressure-sensitive paper is also preferably used. Specific examples thereof include crystal violet lactone, malachite green lactone, benzoyl leuco methylene blue, 2-(N-phenyl-N-methylamino)-6-(N-p-tolyl-N-ethyl)aminofluoran, 2-anilino-3-methyl-6-(n-ethyl-p-tolidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-pipelidino-6-methyl-7-anilinofluoran, 3-pyrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)$_4$-phthalide and 3-(4-diethylaminophenyl)-3-(1-ethyl-2-methylindol-3-yl) phthalide.

The dye discolored by an acid or radical is preferably added in an amount of 0.01 to 10% by weight based on the solid content of the image-recording layer.

It is preferred to add a small amount of a thermal polymerization inhibitor to the image-recording layer according to the invention in order to prevent undesirable thermal polymerization of the polymerizable compound during the production or preservation of the image-recording layer.

The thermal polymerization inhibitor preferably includes, for example, hydroquinone, p-methoxyphenol, di-tert-butyl-p-cresol, pyrogallol, tert-butyl catechol, benzoquinone, 4,4'- thiobis(3-methyl-6-tert-butylphenol), 2,2'-methylenebis(4-methyl-6-tert-butylphenol) and N-nitroso-N-phenylhydroxylamine aluminum salt.

The thermal polymerization inhibitor is preferably added in an amount of about 0.01 to about 5% by weight based on the total solid content of the image-recording layer.

To the image-recording layer according to the invention, a higher fatty acid derivative, for example, behenic acid or behenic acid amide may be added to localize on the surface of the image-recording layer during a drying step after coating in order to avoid polymerization inhibition due to oxygen. An amount of the higher fatty acid derivative added is preferably from about 0.1 to about 10% by weight based on the total solid content of the image-recording layer.

The image-recording layer according to the invention may also contain a plasticizer in order to improve the on-machine developing property. The plasticizer preferably includes, for example, a phthalic acid ester, e.g., diemthylphthalate, diethylphthalate, dibutylphthalate, diisobutylphthalate, dioctylphthalate, octylcaprylphthalate, dicyclohexylphthalate, ditridecylphthalate, butylbenzylphthalate, diisodecylphthalate or diallylphthalate; a glycol ester, e.g., dimethylglycolphthalate, ehtylphtalylethylglycolate, methylphthalylethylglycolate, butylphthalylbutylglycolate or triethylene glycol dicaprylate ester; a phosphoric acid ester, e.g., tricresylphosphate or triphenylphosphate; an aliphatic dibasic acid ester, e.g., diisobutyladipate, dioctyladipate, dimethylsebacate, dibutylsebacate, dioctylazelate or dibutylmaleate; polyglycidylmethacrylate, triethyl citrate, glycerin triacetyl ester and butyl laurate.

The plasticizer is preferably added in an amount of about 30% by weight or less based on the total solid content of the image-recording layer.

The image-recording layer according to the invention may contain fine inorganic particle in order to enhance the interface adhesion due to surface roughening, to increase the hardened film strength in the image area and to improve the on-machine developing property in the non-imaging area.

The fine inorganic particle preferably includes, for example, silica, alumina, magnesium oxide, titanium oxide, magnesium carbonate, calcium alginate and a mixture thereof. The fine inorganic particle preferably has an average particle size from 5 nm to 10 μm and more preferably from 0.5 to 3 μm. In the above-described range, it is stably dispersed in the image-recording layer, sufficiently maintains the film strength of the image-recording layer and can form the non-imaging area excellent in hydrophilicity and preventing from stain during printing.

The fine inorganic particle described above is easily available as a commercial product, for example, colloidal silica dispersion.

An amount of the fine inorganic particle added is preferably 20% by weight or less and more preferably 10% by weight or less based on the total solid content of the image-recording layer.

The image-recording layer according to the invention may contain a hydrophilic low molecular weight compound in order to improve the on-machine developing property. The hydrophilic low molecular weight compound includes a water soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof an organic sulfonic acid, e.g., toluene sulfonic acid or benzene sulfonic acid, or a salt thereof, an organic phosphonic acid, e.g., phenyl phosphonic acid, or a salt thereof an organic carboxylic acid, e.g., tartaric acid, oxalic acid, citric acid, maleic acid, lactic acid, gluconic acid or an amino acid, or a salt thereof and an organic quaternary ammonium salt, e.g., tetraethyl ammonium chloride.

In the invention, in order to incorporate the above-descried component into the image-recording layer, the component can be included in fine particle, for example, microcapsule to be contained in the image-recording layer, if desired. The component can also be partially included in the fine particle and the reminder thereof can be present outside the fine particle in an appropriate ratio. The image-recording layer is improved in the on-machine developing property by the incorporation of fine particle.

As a method of producing the fine particle including the constituting component of the image-recording layer, known methods can be used. Methods of producing the fine particle include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferred fine particle wall used in the invention has three-dimensional crosslinkage and has a solvent-swellable property. From this point of view, a preferred wall material of the fine particle includes polyurea, polyurethane, polyester, polycarbonate, polyamide and a mixture thereof and particularly polyurea and polyurethane are preferred. Further, a compound having a crosslinkable functional group, for example, an ethylenically unsaturated bond, capable of being introduced into the binder polymer described above may be introduced into the wall of fine particle.

An average particle size of the fine particle is preferably from 0.01 to 3.0 μm, more preferably from 0.05 to 2.0 μm and particularly preferably from 0.10 to 1.0 μm. In the above-described range, preferable resolution and preservation stability can be achieved.

The image-recording layer according to the invention is formed by dissolving or dispersing each of the necessary constituting components described above in a solvent according the manner described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetat, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The image-recording layer according to the invention may also be formed by preparing plural coating solutions by dispersing or dissolving the same or different components described above into the same or different solvents and conducting repeatedly plural coating and drying.

A coating amount of the image-recording layer (solid content) is preferably from 0.3 to 3.0 g/m$^2$ and more preferably from 0.5 to 1.5 g/m$^2$.

Various methods can be used for the coating. Examples of the method include bar coater coating, spin coating, spray coating, curtain coating, dip coating, air knife coating, blade coating and roll coating.

(Support)

The support for use in the lithographic printing plate precursor according to the invention is not particularly restricted as long as it is a dimensionally stable plate-like material. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. A preferred support includes, a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials conventionally known and used can be appropriately utilized.

The thickness of the support is preferably from 0.1 to 0.6 mm, more preferably from 0.15 to 0.4 mm, and still more preferably from 0.2 to 0.3 mm.

Prior to the use of aluminum plate, a surface treatment, for example, roughening treatment or anodizing treatment is preferably performed. The surface treatment facilitates improvement in the hydrophilic property and ensure for adhesion between the image-recording layer and the support. Prior to the roughening treatment of the aluminum plate, a degreasing treatment, for example, with a surfactant, an organic solvent or an aqueous alkaline solution is conducted for removing rolling oil on the surface htereof if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, ball grinding, brush grinding, blast grinding or buff grinding can be used.

The electrochemical roughening treatment method includes, for example, a method of conducting by passing alternating current or direct current in an electrolyte containing an acid, for example, hydrochloric acid or nitric acid. Also, a method of using a mixed acid described in JP-A-54-63902 can be used.

The aluminum plate subjected to the roughening treatment is subjected, if desired, to an alkali etching treatment using an aqueous solution, for example, of potassium hydroxide or sodium hydroxide and further subjected to a neutralizing treatment, and then subjected to an anodizing treatment for improving the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions for the anodizing treatment are varied depending on the electrolyte used, they cannot be defined commonly. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$ and more preferably from 1.5 to 4.0 g/m$^2$. In the above-described range, good printing durability and good scratch resistance in the non-image area of lithographic printing plate can be achieved.

The aluminum plate subjected to the anodizing treatment is subjected to a hydrophilizing treatment on the surface thereof if desired. The hydrophilizing treatment includes an alkali metal silicate method described in U.S. Pat. Nos. 2,714,066, 3,181,461, 3,280,734 and 3,902,734. In the method, the support is subjected to immersion treatment or electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461 and 4,689,272.

In the case of using a support having insufficient hydrophilicity, for example, a polyester film, in the invention, it is desirable to coat a hydrophilic layer thereon to make the surface sufficiently hydrophilic. The hydrophilic layer preferably used includes a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate and a hydrophilic layer comprising an inorganic thin layer having a surface containing metal oxide. Among them, the hydrophilic layer formed by coating a coating solution containing a colloid of an oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion of the hydrophilic layer to the support. As the antistatic layer, a polymer layer having fine particles of metal oxide or a matting agent dispersed therein described in JP-A-2002-79772 may be used.

The support preferably has a center line average roughness of from 0.10 to 1.2 μm. In the above-described range, good adhesion with the image-recording layer, good printing durability, and good resistance to stain can be achieved.

Further, color density of the support is preferably from 0.15 to 0.65 in terms of a reflection density value. In the above-described range, good image-forming property due to prevention of halation at the image exposure and good plate inspection property after development can be achieved.

(Back Coat)

After applying the surface treatment or forming the undercoat layer to the support, a back coat layer can be provided on the back surface of the support, if desired.

The back coat layer preferably used includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$, or $Si(OC_4H_9)_4$ is preferred since the starting material is inexpensive and easily available.

(Undercoat Layer)

In the lithographic printing plate precursor according to the invention, particularly in the lithographic printing plate precursor of on-machine development type, an undercoat layer is provided between the support and the image-recording layer, if desired. The undercoat layer makes removal of the image-recording layer from the support in the unexposed area easy so that the on-machine development property can be improved. Further, it is advantageous that in the case of infrared laser exposure, since the undercoat layer acts as a heat insulating layer, heat generated upon the exposure does not diffuse into the support and is efficiently utilized so that increase in sensitivity can be achieved.

As a compound (undercoat compound) for the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified.

As the most preferred compound for undercoat layer, a polymer resin obtained by copolymerization of a monomer having an adsorbing group, a monomer having a hydrophilic group and a monomer having a crosslinkable group is exemplified.

The essential component in the polymer undercoating is an adsorbing group to the hydrophilic surface of the support. Whether adsorptivity to the hydrophilic surface of the support is present or not can be judged, for example, by the following method.

A test compound is dissolved in an easily soluble solvent to prepare a coating solution, and the coating solution is coated and dried on a support so as to have the coating amount after drying of 30 mg/m². After thoroughly washing the support coated with the test compound using the easily soluble solvent, the residual amount of the test compound that has not been removed by the washing is measured to calculate the adsorption amount to the support. For measuring the residual amount, the residual amount of the test compound may be directly determined, or may be calculated by determining the amount of the test compound dissolved in the washing solution. The determination for the compound can be performed, for example, by X-ray fluorescence spectrometry, reflection absorption spectrometry or liquid chromatography. The compound having the adsorptivity to support is a compound that remains by 1 mg/m² or more even after conducting the washing treatment described above.

The adsorbing group to the hydrophilic surface of the support is a functional group capable of forming a chemical bond (for example, an ionic bond, a hydrogen bond, a coordinate bond or a bond with intermolecular force) with a substance (for example, metal or metal oxide) or a functional group (for example, a hydroxy group) present on the surface of the support. The adsorbing group is preferably an acid group or a cationic group.

The acid group preferably has an acid dissociation constant (pKa) of 7 or less. Examples of the acid group include a phenolic hydroxy group, a carboxyl group, —$SO_3H$, —$OSO_3H$, —$PO_3H_2$, —$PO_3H_2$, —$CONHSO_2$—, —$SO_2NHSO_2$— and —$COCH_2COCH_3$. Among them, —$OPO_3H_2$ and —$PO_3H_2$ are particularly preferred. The acid group may be the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and iodonium group. Among them, the ammonium group, phosphonium group and sulfonium group are preferred, the ammonium group and phosphonium group are more preferred, and the ammonium group is most preferred.

Particularly preferred examples of the monomer having the adsorbing group include compounds represented by the following formula (III) or (IV):

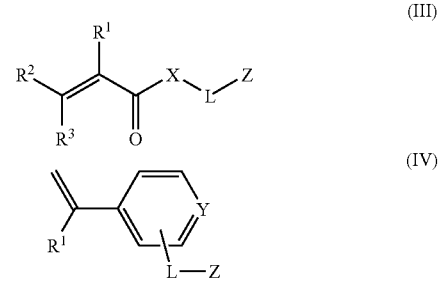

In formula (III) or (IV), $R^1$, $R^2$ and $R^3$ each independently represents a hydrogen atom, halogen atom or an alkyl group having from 1 to 6 carbon atoms. $R^1$ and $R^2$ and $R^3$ each independently represents preferably a hydrogen atom or an alkyl group having from 1 to 6 carbon atoms, more preferably a hydrogen atom or an alkyl group having from 1 to 3 carbon atoms and, most preferably a hydrogen atom or methyl. It is particularly preferred that $R^2$ and $R^3$ each represents a hydrogen atom.

In the formula (III), X represents an oxygen atom (—O—) or imino group (—NH—). Preferably, X represents an oxygen atom. In the formula (III) or (IV), L represents a divalent connecting group. It is preferred that L represents a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted arylene group), a divalent heterocyclic group or a combination of each of the groups described above with an oxygen atom (—O—), a sulfur atom (—S—), an imino group (—NH—), a substituted imino group (—NR—, where R represents an aliphatic group, an aromatic group or a heterocyclic group) or a carbonyl group (—CO—).

The aliphatic group may form a cyclic structure or a branched structure. The number of carbon atoms of the aliphatic group is preferably from 1 to 20, more preferably from 1 to 15, and most preferably from 1 to 10. It is preferred that the aliphatic group is a saturated aliphatic group rather than an unsaturated aliphatic group. The aliphatic group may have a substituent. Examples of the substituent include a halogen atom, a hydroxy group, an aromatic group and a heterocyclic group.

The number of carbon atoms of the aromatic group is preferably from 6 to 20, more preferably from 6 to 15 and most preferably from 6 to 10. The aromatic group may have a substituent. Examples of the substituent include a halogen atom, a hydroxy group, an aliphatic group, an aromatic group and a heterocyclic group.

It is preferred that the heterocyclic group has a 5-membered or 6-membered ring as the hetero ring. Other heterocyclic ring, an aliphatic group or an aromatic ring may be condensed to the heterocyclic ring. The heterocyclic group may have a substituent. Examples of the substituent include a halogen atom, a hydroxy group, an oxo group (=O), a thio group (=S), an imino group (=NH), a substituted imino group (=N—R, where R represents an aliphatic group, an aromatic group or a heterocyclic group), an aliphatic group, an aromatic group and a heterocyclic group.

It is preferred that L represents a divalent connecting group containing a plurality of polyoxyalkylene structures. It is more preferred that the polyoxyalkylene structure is a polyoxyethylene structure. Specifically, it is preferred that L contains —(OCH$_2$CH$_2$)$_n$— (n is an integer of 2 or more).

In the formula (III) or (IV), Z represents a functional group adsorbing to the hydrophilic surface of the support. Y represents a carbon atom or a nitrogen atom. In the case where Y is a nitrogen atom and L is connected to Y to form a quaternary pyridinium group, Z is not mandatory, because the quaternary pyridinium group itself exhibits the adsorptivity.

Representative examples of the monomer represented by formula (III) or (IV) are set forth below.

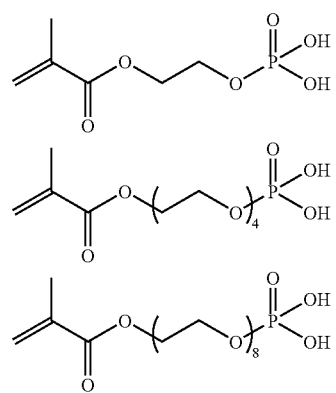

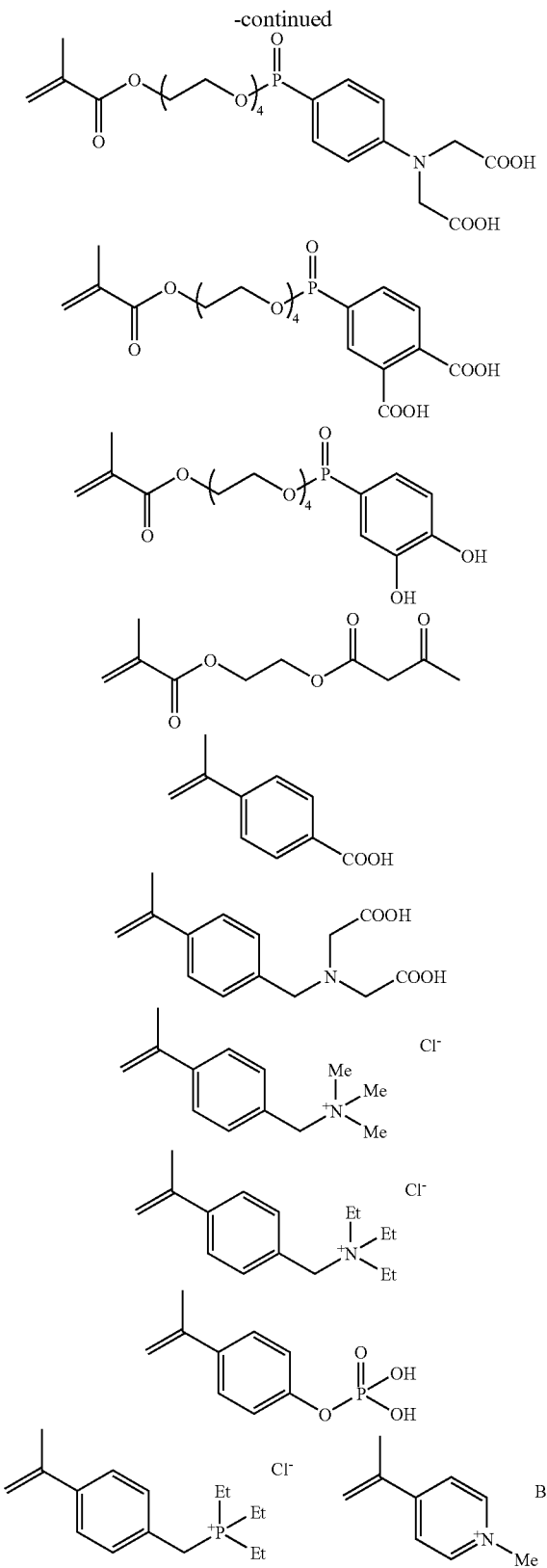

The hydrophilic group included in the polymer resin for the undercoat layer for use in the invention preferably includes, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group. Among them, a monomer having a sulfonic acid group exhibiting a highly hydrophilic property is preferable. Specific examples of the monomer having a sulfonic acid group include sodium salt or an amine salt of methacryloxybenzenesulfonic acid, acryloxybenzenesulfonic acid, allylsulfonic acid, vinylsulfonic acid, allylsulfonic acid, p-styrenesulfonic acid, methacrylsulfonic acid, acrylamido-tert-butylsulfonic acid, 2-acrylamido-2-methylpropanesulfonic acid and (3-acryloyloxypropyl)buthylsulfonic acid. Among them, from the standpoint of the hydrophilic property and handling property in the synthesis thereof, sodium salt of 2-acrylamido-2-methylpropanesulfonic acid is preferable.

It is preferred that the water-soluble polymer resin for the undercoat layer according to the invention has a crosslinkable group. The crosslinkable group acts to improve the adhesion to the image area. In order to impart the crosslinking property to the polymer resin for the undercoat layer, introduction of a crosslinking functional group, for example, an ethylenically unsaturated bond into the side chain of the polymer, or introduction by formation of a salt structure between a polar substituent of the polymer resin and a compound containing a substituent having a counter charge to the polar substituent of the polymer resin and an ethylenically unsaturated bond is used.

Examples of the polymer having an ethylenically unsaturated bond in the side chain thereof include a polymer of an ester or amide of acrylic acid or methacrylic acid, which is a polymer wherein the ester or amide residue (R in —COOR or —CONHR) has an ethylenically unsaturated bond.

Examples of the residue (R described above) having an ethylenically unsaturated bond include —$(CH_2)_n$CR$_1$=CR$_2$R$_3$, —$(CH_2O)_n$CH$_2$CR$_1$=CR$_2$R$_3$, —$(CH_2CH_2O)_n$CH$_2$CR$_1$=CR$_2$R$_3$, —$(CH_2)_n$NH—CO—O—CH$_2$CR$_1$=CR$_2$R$_3$, —$(CH_2)_n$—O—CO—CR$_1$=CR$_2$R$_3$ and —$(CH_2CH_2O)_2$—X (wherein R$_1$ to R$_3$ each independently represents a hydrogen atom, a halogen atom or an alkyl group having from 1 to 20 carbon atoms, an aryl group, alkoxy group or aryloxy group, or R$_1$ and R$_2$ or R$_1$ and R$_3$ may be combined with each other to form a ring. n represents an integer of 1 to 10. X represents a dicyclopentadienyl residue).

Specific examples of the ester residue include —CH$_2$CH=CH$_2$ (described in JP-B-7-21633) —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NHCOO—CH$_2$CH=CH$_2$ and —CH$_2$CH$_2$O—X (wherein X represents a dicyclopentadienyl residue).

Specific examples of the amide residue include —CH$_2$CH=CH$_2$, —CH$_2$CH$_2$O—Y (wherein Y represents a cyclohexene residue) and —CH$_2$CH$_2$OCO—CH=CH$_2$.

As a monomer having a crosslinkable group for the polymer resin for undercoat layer, an ester or amide of acrylic acid or methacrylic acid having the crosslinkable group is preferred.

A content of the crosslinking group in the polymer resin for undercoat layer (content of the radical polymerizable unsaturated double bond determined by iodine titration) is preferably from 0.1 to 10.0 mmol, more preferably from 1.0 to 7.0 mmol and most preferably from 2.0 to 5.5 mmol, based on 1 g of the polymer resin. In the above-described range, preferable compatibility between the sensitivity and stain resistance and good preservation stability can be obtained.

A weight average molecular weight of the polymer resin for undercoat layer is preferably 5,000 or more, more preferably from 10,000 to 300,000. A number average molecular weight of the polymer resin is preferably 1,000 or more, more preferably from 2,000 to 250,000. Polydispersity (weight average molecular weight/number average molecular weight) thereof is preferably from 1.1 to 10.

The polymer resin for undercoat layer may be any of a random polymer, a block polymer, a graft polymer and the like, and preferably a random polymer.

The polymer resins for undercoat layer may be used individually or in a mixture of two or more thereof.

A coating amount (solid content) of the undercoat layer is preferably from 0.1 to 100 mg/m$^2$, and more preferably from 1 to 30 mg/m$^2$.

It is a particularly preferable embodiment that the compound having a polymerizable group also has an adsorbing group to support and a hydrophilicity-imparting group in the molecule thereof in view of further improvement in the adhesion, the on-machine developing property and stain resistance. The term "adsorbing group to support" as used herein means a group capable of ordinarily forming an ionic bond, a hydrogen bond, a coordinate bond or a bond with intermolecular force with metal, a metal oxide, a hydroxy group or the like present on the support subjected to the anodizing treatment or hydrophilizing treatment. As the adsorbing group to support, an acid group or an onium group is preferable. As the acid group, an acid group having an acid dissociation constant (pKa) of 7 or less is preferable. Specific examples of the acid group include —COOH, —SO$_3$H, —OSO$_3$H, —PO$_3$H$_2$, —OPO$_3$H$_2$, —CONHSO$_2$— and —SO$_2$NHSO$_2$—. Among them, —PO$_3$H$_2$ is particularly preferred. As the onium group, an onium group formed from an atom belonging to Group 5B (Group 15) or Group 6B (Group 16) of the periodic table is preferable, an onium group formed from a nitrogen atom, a phosphorus atom or a sulfur atom is more preferable, and an onium group formed from a nitrogen atom is particularly preferable. As the hydrophilicity-imparting group, for example, an ethyleneoxide group (—OCH$_2$CH$_2$—) and a sulfonic acid group are exemplified.

A coating amount (solid content) of the undercoat layer is preferably from 0.1 to 100 mg/m$^2$, and more preferably from 1 to 30 mg/m$^2$.

[Plate-Making of Lithographic Printing Plate Precursor]

The lithographic printing plate precursor according to the invention is exposed through a transparent original having line images, dot images and the like or subjected to laser scanning exposure based on digital data to perform imagewise exposure. As a light source for the exposure, for example, a carbon arc lamp, a high-pressure mercury lamp, a xenon lamp, a metal halide lamp, a fluorescent lamp, a tungsten lamp, a halogen lamp, an ultraviolet ray laser, a visible light laser and an infrared ray laser are exemplified. The laser is particularly preferred and includes, for example, a solid laser and a semiconductor laser emitting an infrared ray having a wavelength of 760 to 1,200 nm and a semiconductor laser emitting light having a wavelength of 250 to 420 nm. In case of using the laser, it is preferred to conduct imagewise scanning exposure according to digital data Also, in order to shorten the exposure time, it is preferred to use a multibeam laser device.

In case of using the infrared ray laser, the exposure time per pixel is preferably within 20 μs. Also, the irradiation energy is preferably from 10 to 300 mJ/cm$^2$.

In case of using the ultraviolet ray laser, it is desirable to make the pixel residence time as short as possible in order to restrain a competing reaction with oxygen. It is preferably 1 millisecond or shorter, more preferably 500 μs or shorter, and most preferably 100 μs or shorter. The irradiation energy is preferably from 0.1 to 10 mJ/cm$^2$.

The lithographic printing plate precursor according to the invention is imagewise exposed by a laser beam and then subjected to printing by supplying oily ink and an aqueous component without undergoing any development processing step.

Specifically, for instance, a method wherein the lithographic printing plate precursor is exposed by a laser beam and mounted on a printing machine to perform printing without undergoing the development processing step, and a method wherein the lithographic printing plate precursor is mounted on a printing machine, exposed by a laser beam on the printing machine and then subjected to printing without undergoing the development processing step are exemplified.

After imagewise exposure of the lithographic printing plate precursor by a laser beam, when the aqueous component and oily ink are supplied to perform printing without undergoing the development processing step, for example, a wet development processing step, the image-recording layer hardened by the exposure forms the oily ink-receptive area having an oleophilic surface in the exposed area of the image-recording layer. On the other hand, in the unexposed area, the unhardened image-recording layer is removed by dissolution or dispersion with the aqueous component and/or oily ink supplied to reveal a hydrophilic surface in the area.

As a result, the aqueous component is adhered on the revealed hydrophilic surface and the oily ink is deposited on the image-recording layer in the exposed area and printing is initiated. While either the aqueous component or the oily ink may be supplied at first to the plate surface, it is preferred to supply the oily ink at first for preventing the aqueous component from contamination with the image-recording layer in the unexposed area. As the aqueous component and oily ink, dampening water and printing ink for conventional lithographic printing are respectively used.

Thus, the lithographic printing plate precursor is subjected to the on-machine development on an offset printing machine and used as it is for printing a large number of sheets.

[Lithographic Printing Method]

In the lithographic printing method according to the invention, the dampening water used is characterized by containing the phosphonium compound represented by formula (I) described above. Other steps from the image exposure to the printing are performed in the same manner as in the plate-making of the lithographic printing plate precursor described above. According to the lithographic printing method using the specific dampening water, the effects of the invention, for example, the stable ink-receptive property during printing can be achieved, even when a lithographic printing plate precursor which does not contain the above-described phosphonium compound.

As components other than the phosphonium compound in the dampening water used in the lithographic printing method according to the invention, components described in JP-A-5-112085 and JP-A-6-183171 can be appropriately used.

For instance, as (a) a hydrophilic polymer compound having a film-forming property, a cellulose derivative having a substitution rate of 20 to 90%, for example, hydroxyethyl cellulose, hydroxypropyl cellulose, methyl cellulose, hydroxypropyl methyl cellulose or hydroxybutyl methyl cellulose, or a glyoxal-modified compound of the cellulose derivative is preferably used. The cellulose derivatives may be used individually or in combination of two or more thereof. The amount thereof preferably used is in a range of 0.1 to 10% by weight of the dampening water.

A water-soluble polymer compound other than the cellulose derivative may be used together. For instance, there are exemplified natural products, for example, gum arabic, a starch derivative (e.g., dextrin, enzyme-decomposed dextrin, hydroxypropylated enzyme-decomposed dextrin, caboxymethylated starch, phosphoric acid starch or octenyl succinated starch), an alginate or a cellulose derivative (e.g., carboxymethyl cellulose, carboxyethyl cellulose or methyl cellulose) and modified products thereof, and synthetic products, for example, polyethylene glycol or a derivative thereof, polyvinyl pyrrolidone, polyacrylamide or a copolymer thereof, polyacrylic acid or a copolymer thereof, vinyl methyl ether/maleic anhydride copolymer, vinyl acetate/maleic anhydride copolymer or polystyrenesulfonic acid or a copolymer thereof. The polymer compounds may be used individually or in combination of two or more thereof. The concentration range thereof preferably used is in a range of 0.005 to 1% by weight of the dampening water composition.

As (b) a pH buffering agent, a water-soluble organic acid, inorganic acid and salts thereof are exemplified. The pH buffering agent is effective on pH controlling or pH buffering of the dampening water, appropriate etching or preventing corrosion of the support of lithographic printing plate. Preferred examples of the organic acid include citric acid, ascorbic acid, malic acid, tartaric acid, lactic acid, acetic acid, gluconic acid, acetic acid, hydroxyacetic acid, oxalic acid, malonic acid, maleic acid, levulinic acid, phytic acid and an organic phosphonic acid. Examples of the inorganic acid include phosphoric acid, nitric acid and sulfuric acid. Further, an alkali metal salt, an alkaline earth metal salt, an ammonium salt and an organic amine salt of the organic acid and inorganic acid are also preferably used. The organic acids, inorganic acids and salts thereof may be used individually or in combination of two or more thereof. An alkali metal hydroxide, an alkali metal phosphate, an alkali metal carbonate and an alkali metal silicate may also be used.

As (c) a compound for further improving wetting of a water-supplying roller and practicing stabilization of water-supplying, there are exemplified, for example, propylene glycol, dipropylene glycol, tripropylene glycol, tetrapropylene glycol, propylene glycol monomethyl ether, dipropylene glycol monomethyl ether, tripropylene glycol monomethyl ether, tetrapropylene glycol monomethyl ether, propylene glycol monoethyl ether, dipropylene glycol monoethyl ether, tripropylene glycol monoethyl ether, tetrapropylene glycol monoethyl ether, propylene glycol monopropyl ether, dipropylene glycol monopropyl ether, tripropylene glycol monopropyl ether, tetrapropylene glycol monopropyl ether, propylene glycol monoisopropyl ether, dipropylene glycol monoisopropyl ether, tripropylene glycol monoisopropyl ether, tetrapropylene glycol monoisopropyl ether, propylene glycol monobutyl ether, dipropylene glycol monobutyl ether, tripropylene glycol monobutyl ether, tetrapropylene glycol monobutyl ether, propylene glycol monoisobutyl ether, dipropylene glycol monoisobutyl ether, tripropylene glycol monoisobutyl ether, tetrapropylene glycol monoisobutyl ether, propylene glycol monotertiarybutyl ether, dipropylene glycol monotertiarybutyl ether, tripropylene glycol monotertiarybutyl ether, tetrapropylene glycol monotertiarybutyl ether, and polypropylene glycol having a molecular weight of 200 to 1,000 and monomethyl ether, monoethyl ether, monopropyl ether, monoisopropyl ether and monobutyl ether thereof. The compounds may be used individually or in combination of two or more thereof. The amount of the compound preferably used is in a range of 10 to 70% by weight of the dampening water. Among them, the compound which exhibits surface tension of 55 dyne/cm or less when it is dissolved to form an aqueous solution having the concentration of 0.1 to 0.5% by weight.

As (d) a compound useful for concentration of the dampening water, there are exemplified, for example, 3-methoxybutanol, 3-ethoxybutanol, 3-propoxybutanol, 3-methyl-3-methoxybutanol, 3-methyl-3-ethoxybutanol and 3-methyl-3-propoxybutanol. The compounds may be used individually or in combination of two or more thereof. The amount of the compound preferably used is in a range of 0.1 to 20% by weight of the dampening water.

As specific examples of (e) a compound effective for preventing deterioration in the image area of printing plate due to solvent residue occurred by evaporation of water, there are exemplified, for example, benzenesulfonic acid, p-toluenesulfonic acid, xylenesulfonic acid, cumenesulfonic acid, benzoic acid, salicylic acid, isophthalylsulfonic acid, gallic acid, phenolsulfonic acid, thiosalicylic acid, 4-(butylphenyl)-2-hydroxybenzenesulfonic acid, 4-(butylphenyl)benzenesulfonic acid and diphenylether sulfonic acid. The alkali metal salt (e.g., Na, K or Li salt) and ammonium salt thereof are also effectively used. The amount of the compound preferably used is in a range of 0.01 to 7% by weight of the dampening water. The compounds may be used individually or in combination of two or more thereof.

In addition, a salt exhibiting a corrosion inhibiting effect of a printing plate and a metal portion used in a printing machine is used. Examples of the salt include sodium nitrate, potassium nitrate, ammonium nitrate, magnesium nitrate, calcium nitrate, beryllium nitrate, aluminum nitrate, zinc nitrate, zirconium nitrate, nickel nitrate, manganese nitrate and chromium nitrate. The salts may be used individually or in combination of two or more thereof.

Further, a surfactant may be added to the dampening water. For instance, as an anionic surfactant, there are exemplified fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxyethylenepropylsulfonic acid salts, polyoxyethylene alkyl sulfophenyl ether salts, N-methyl-N-oleyltaurin sodium salt, N-alkylsulfosuccinic monoamide disodium salts, petroleum sulfonic acid salts, sulfated caster oil, sulfated beef-tallow oil, sulfuric eater salts of fatty acid alkyl esters, alkylsulfuric acid ester salts, polyoxyethylene alkyl ether sulfuric acid ester salts, fatty acid monoglyceride sulfuric acid ester salts, polyoxyethylene alkyl phenyl ether sulfuric acid ester salts, polyoxyethylene styryl phenyl ether sulfuric acid ester salts, alkylphosphoric acid ester salts, polyoxyethylene alkyl ether phosphoric acid ester salts, polyoxyethylene alkyl phenyl ether phosphoric acid ester salts, partially saponified styrene/maleic anhydride copolymers, partially saponified olefin/maleic anhydride copolymers and formaldehyde condensates of naphthalenesulfonates. Among them, the dialkylsulfosuccinic acid salts, alkylsulfuric acid ester salts and alkylnaphthalenesulfonic acid salts are particularly preferably used.

As a nonionic surfactant, there are exemplified polyoxyethylene alkyl ethers, polyoxyethylene alkyl phenyl ethers, polyoxyethylene polystyryl phenyl ethers, polyoxyethylenepolyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylenesorbitan fatty acid partial esters, polyoxyethylenesorbitol fatty acid partial esters, polyethylene glycol fatty acid esters, polyglycerin fatty acid partial esters, polyoxyethylenized castor oils, polyoxyethyleneglycerin fatty acid partial esters, fatty acid diethanolamides, N,N-bis-2-hydroxyalkylamines, polyoxyethylene alkylamines, triethanolamine fatty acid esters and trialkylamine oxides. In addition, fluorine-based surfactants and silicon-based surfactants are also used. Among them, the polyoxyethylene alkyl phenyl ethers and polyoxyethylenepolyoxypropylene block polymers are preferably used.

As a cationic surfactant, there are exemplified alkylamine salts, quaternary ammonium salts, polyoxyethylene alkylamine salts, and polyethylene polyamine derivatives.

The content of the surfactant is ordinarily 10% by weight or less, preferably from 0.01 to 3.0% by weight of the dampening water in view of foam formation.

Further, as a wetting agent, for example, ethylene glycol, triethylene glycol, butylenes glycol, hexylene glycol, octane diol, diethylene glycol, glycerin, trimethylol propane or diglycerin is preferably used. The wetting agents may be used individually or in combination of two or more thereof. The wetting agent is preferably used in an amount of 0.1 to 25% by weight of the dampening water.

Further, a chelating compound may be added to the dampening water composition according to the invention. The dampening water composition is ordinarily used by adding tap water, well water or the like to dilute. Calcium ion or the like included in the tap water or well water used for the dilution adversely affects printing and may be apt to cause stain on print. In such a case, the problem can be solved by adding the chelating compound. Preferred examples of the chelating compound include ethylenediaminetetraacetic acid, potassium salt thereof sodium salt thereof, diethylentriaminepentaacetic acid, potassium salt thereof sodium salt thereof, triethylenetetraminehexaacetic acid, potassium salt thereof, sodium salt thereof hydroxyethylethylenediaminetriacetic acid, potassium salt thereof, sodium salt thereof nitrilotriacetic acid or sodium salt thereof, and organic phosphonic acids and phosphonoalkane tricarboxylic acids, e.g., 1-hydroxyethane-1,1-diphosphonic acid, potassium salt thereof sodium salt thereof aminotri(methylenephosphonic acid), potassium salt thereof or sodium salt thereof. Organic amine salt is also effectively used in place of the sodium salt or potassium salt of the above-described chelating compound. The chelating compound which is stably present in the dampening water composition and does not disturb printing is preferably used.

Further, an antirust agent may be added to the dampening water composition according to the invention. Examples of the antirust agent include benzotriazole, 5-methylbenzotriazole, 5-methoxybenzotriazole, 4-chlorobenzotriazole, 4-bromobenzotriazole, 4-bromo-6-methylbenzotriazole and 4-bromo-6-trifluoromethylbenzotriazole. Also, there are exemplified compounds wherein the 1H position of the above-described compounds is substituted with an alkali metal salt (e.g., Na, K or Li salt) or $NH_4$, benzimidazole and derivatives thereof, mercapto compounds and/or thioether compounds, for example, mercaptoacetic acid, 2-mercaptopropionic acid, 3-mercaptopropionic acid, 4-mercaptobutanoic acid, 2,4-dimercaptobutanoic acid, 2-mercaptotetradecanoic acid, 2-mercaptomyristic acid, mercaptosuccinic acid, 2,3-dimercaptosuccinic acid, cysteine, N-acetylcysteine, N-(2-mercaptopropionyl)glycine, N-(2-mercapto-2-methylpropionyl)glycine, N-(3-mercaptopropionyl)glycine, N-(2-mercapto-2-methylpropionyl)cysteine, penicilamine, N-acetylpenicilamine, glycine-cysteine-glutamine condensate, N-(2,3-dimercaptopropionyl)glycine, 2-mercaptonicotinic acid, thiosalycilic acid, 3-mercaptobenzoic acid, 4-mercaptobenzoic acid, 3-carboxy-2-mercaptopyridine, 2-mercaptobenzothiazole-5-carboxylic acid, 2-mercapto-3-phenylpropane, 2-mercapto-5-carboxyethylimidazole, 5-mercapto-1-(4-carboxyphenyl)tetrazole, N-(3,5-dicarboxyphenyl)-2-mercaptotetrazole, 2-(1,2-dicarboxyethylthio)-5-mercapto-1,3,4-triadiazole, 2-(5-mercapto-1,3,4-thidiazolylthio)hexanoic acid, 2-mercaptoethanesulfonic acid, 2,3- dimercapto-1-propanesulfonic acid, 2-mercaptobenzenesulfonic acid, 4-mercaptobenzenesulfonic acid, 3-mercapto-4-(2-sulfophenyl)-1,2,4-triazole, 2-mercaptobenzothiazole-5-sulfonic acid, 2-mercaptobenzimidazole-6-sulfonic acid, mercaptosuccinimide, 4-mercaptobenzenesulfonamide, 2-mercaptobenzimidazole-5-sulfonic amide, 3-mercapto-4-(2-(methylaminosulfonyl) ethoxy)toluene, 3-mercapto-4-(2-(methylsulfonylamino) ethoxy)toluene, 4-mercapto-N-(p-methylphenylsulfonyl) bezamide, 4-mercaptophenol, 3-mercaptophenol, 2-mercaptophenol, 3,4-dimercaptotoluene, 2-mercaptohydroquinone, 2-thiouracil, 3-hydroxy-2-mrcaptopyridine, 4-hydroxythiophenol, 4-hydroxy-2-mercaptopyrimidine, 4,6-dihydroxy-2-mercaptopyrimidine, 2,3-dihydroxypropylmercaptane, 2-mercapto-4-octylphenyl methanesulfonylaminoethyl ether, 2-mercapto-4-octylphenol methaneaminosulfonylbutyl ether, thiodiglycolic acid, thiodiphenol, 6,8-dithiooctanoic acid, 5-methoxy-2-mercaptobenzimidazole, 2-mercaptobenzimidazole-5-sulfonic acid, and alkali metal salts, alkaline earth metal salts, ammonium salts and organic amine salts of the above-described compounds. The content of the compound is preferably in a range of 0.0001 to 5% by weight of the dampening water. The compounds may be used individually or in combination of two or more thereof.

Moreover, to the dampening water composition according to the invention are added various kinds of coloring agents, antifoaming agents, antiseptic agents and the likes. For instance, as the coloring agent, food dye or the like is preferably used. For example, CI No. 19140 or 15985 is exemplified as a yellow dye, CI No. 16185, 45430, 16255, 45380 or 45100 is exemplified as a red dye, CI No. 42640 is exemplified as a purple dye, CI No. 42090 or 73015 is exemplified as a blue dye, and CI No. 42095 is exemplified as a green dye. As the antifoaming agent, a silicon antifoaming agent is preferably used. Any silicon antifoaming agents of emulsion dispersion type and solubilization type can be used. The amount of the antifoaming agent added is optimally in a range of 0.001 to 1% by weight of the dampening water.

As the antiseptic agent, there are exemplified, for example, phenol or a derivative thereof, formalin, an imidazole derivative, sodium dehydroacetate, a 4-isothiazolin-3-one derivative, a benzotriazole derivative, an amidine or guanidine derivative, a quaternary ammonium salt, a pyridine, quinoline or guanidine derivative, a diazine or triazole derivative and an oxazole or oxazine derivative.

Each of the components is dissolved in water, preferably demineralized water, specifically pure water, to form an aqueous solution, whereby the dampening water composition according to the invention is prepared. When the concentrated solution is used, it is economically preferable to dilute it from 10 to 100 times with tap water, well water or the like.

EXAMPLES

The present invention will be described in more detail with reference to the following examples, but the invention should not be construed as being limited thereto.

Example 1

(Preparation of Support)

An aluminum plate (material: JIS 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was etched by immersing in a 25% by weight aqueous sodium hydroxide solution of 45° C. for 9 seconds, washed with water, then immersed in a 20% by weight nitric acid at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolyte used was a 1% by weight aqueous nitric acid solution (containing 0.5% by weight of aluminum ion) and the electrolyte temperature was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolyte, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying. The plate was subjected to an anodizing treatment using as an electrolyte, a 15% by weight sulfuric acid (containing 0.5% by weight of aluminum ion) at a current density of 15 A/dm$^2$ to form a direct current anodized film of 2.5 g/m$^2$, washed with water and dried to obtain Support. The center line average roughness (Ra) of the support was measured using a stylus having a diameter of 2 μm and it was found to be 0.51 μm.

Undercoat solution (1) shown below was coated on the support described above so as to have a dry coating amount of 10 mg/m$^2$ to prepare a support.

| Undercoat solution (1) | |
|---|---|
| Undercoat compound (1) shown below | 0.017 g |
| Methanol | 9.00 g |
| Water | 1.00 g |

Undercoat Compound (1):

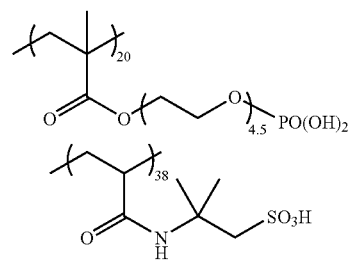

-continued

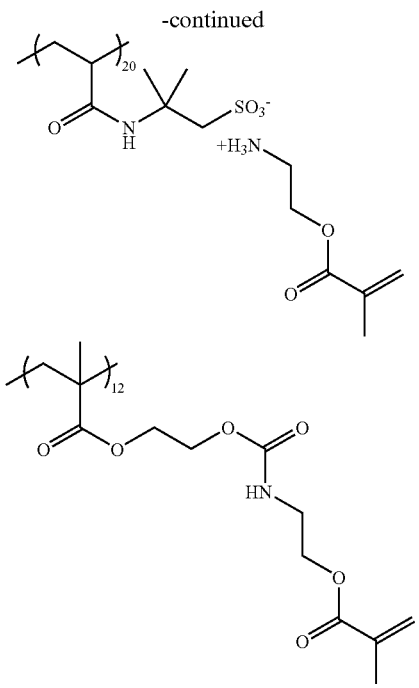

(Formation of Image-Recording Layer and Protective Layer)

Coating solution (1) for image-recording layer having the composition shown below was coated on the above-described support by a bar and dried in an oven at 100° C. for 60 seconds to form an image-recording layer having a dry coating amount of 1.0 g/m². Subsequently, Coating solution (1) for protective layer having the composition shown below was coated on the image-recording layer by a bar and dried in an oven at 120° C. for 60 seconds to form a protective layer having a dry coating amount of 0.15 g/m², thereby preparing Lithographic printing plate precursor (1).

| Coating solution (1) for image-recording layer | |
|---|---|
| Binder polymer (1) shown below | 0.162 g |
| Polymerization initiator (I-13) | 0.100 g |
| Infrared absorbing agent (1) shown below | 0.020 g |
| Polymerizable compound (Aronics M-215, produced by Toagosei Co., Ltd.) | 0.385 g |
| Fluorine-based surfactant (1) shown below | 0.044 g |
| Methyl ethyl ketone | 1.091 g |
| 1-Methoxy-2-propanol | 8.609 g |
| Water | 2.425 g |
| Fine particle (1) prepared described below | 2.640 g |

Binder polymer (1):

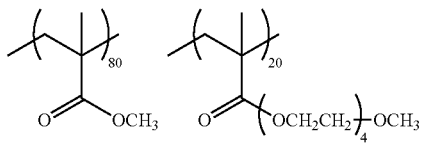

Infrared absorbing agent (1):

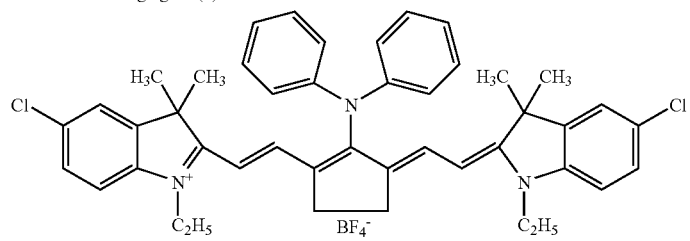

Fluorine-based surfactant (1):

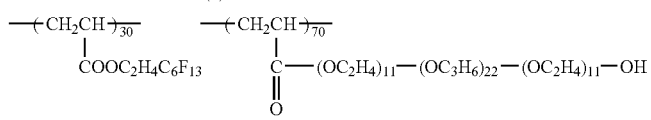

Preparation of Fine Particle (1)

An oil phase component was prepared by dissolving 10 g of adduct of trimethylol propane and xylene diisocyanate (Takenate D-110N, produced by Mitsui Takeda Chemical Co., Ltd., 75% by weight ethyl acetate solution), 6.00 g of Aronix M-215 (produced by Toagosei Co., Ltd.) and 0.12 g of Pionine A-41C (produced by Takemoto Oil and Fat Co., Ltd.) in 16.67 g of ethyl acetate. As an aqueous phase component, 37.5 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at a room temperature for 30 minutes and then at 40° C. for 2 hours. The thus obtained fine particle liquid was diluted using distilled water so as to have the solid concentration of 15% by weight. The average particle size of the fine particle was 0.2 μm.

| Coating solution (1) for protective layer | |
|---|---|
| Dispersion of inorganic fine particle (1) shown below | 1.5 g |
| Tetramethylammonium tetrafluoroborate | 0.04 g |
| Polyvinyl alcohol (PVA-105, saponification degree: 98.5% by mole, polymerization degree: 500, produced by Kuraray Co., Ltd.) | 0.06 g |
| Polyvinylpyrrolidone (K30, molecular weight Mw: 40,000, produced by Tokyo Chemical Industry Co., Ltd.) | 0.01 g |
| Copolymer of vinylpyrrolidone and vinyl acetate (LUVITEC VA64W, copolymerization ratio = 6/4, produced by ICP Co., Ltd.) | 0.01 g |
| Surfactant (EMALEX 710, produced by Nihon-Emulsion Co., Ltd.) | 0.01 g |
| Ion-exchanged water | 6.0 g |

Preparation of Dispersion of Inorganic Fine Particle (1)

To 193.6 g of ion-exchanged water was added 6.4 g of synthetic mica (Somasif ME-100, produced by CO-OP Chemical Co., Ltd.) and the mixture was dispersed using a homogenizer until an average particle size (according to a laser scattering method) became 3 μm to obtain a dispersion of inorganic fine particle. An aspect ratio of the inorganic fine particle thus-obtained was 1,000 or more.

Examples 2 to 4

Lithographic printing plate precursors (2) to (4) were prepared in the same manner as in Example 1 except for using the compounds shown in Table 1 below in place of the tetramethylammonium tetrafluoroborate used in Example 1, respectively.

TABLE 1

| | Compound used |
|---|---|
| Example 2 | Tetrabutylammonium hexafluorophosphate |
| Example 3 | Triethanolamine hydrochloride |
| Example 4 | Monoethanolamine hydrochloride |

Example 5

Coating solution (2) for image-recording layer having the composition shown below was coated on the same support as described in Example 1 by a bar and dried in an oven at 100° C. for 60 seconds to form an image-recording layer having a dry coating amount of 1.5 g/m². Subsequently, Coating solution (2) for protective layer having the composition shown below was coated on the image-recording layer by a bar and dried in an oven at 120° C. for 60 seconds to form an protective layer having a dry coating amount of 0.24 g/m², thereby preparing Lithographic printing plate precursor (5).

| Coating solution (2) for image-recording layer | |
|---|---|
| Binder polymer (1) shown above | 0.162 g |
| Polymerization initiator I-13 | 0.150 g |
| Polymerization initiator S-1 | 0.100 g |
| Infrared absorbing agent (2) shown below | 0.030 g |
| Polymerizable compound (Aronics M-215, produced by Toagosei Co., Ltd.) | 0.385 g |
| Fluorine-based surfactant (1) shown above | 0.044 g |
| Methyl ethyl ketone | 1.091 g |
| 1-Methoxy-2-propanol | 8.609 g |
| Water | 2.425 g |
| Fine particle (1) shown above | 2.640 g |

Infrared absorbing agent (2):

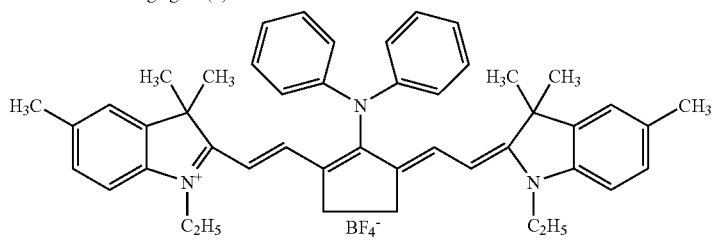

| Coating solution (2) for protective layer | |
|---|---|
| Dispersion of inorganic fine particle (2) shown below | 3.0 g |
| Tetramethylammonium tetrafluoroborate | 0.08 g |
| Polyvinyl alcohol (PVA-105, saponification degree: 98.5% by mole, polymerization degree: 500, produced by Kuraray Co., Ltd.) | 0.08 g |
| Polyvinylpyrrolidone (K30, molecular weight Mw: 40,000, produced | 0.01 g |

| -continued |
|---|
| Infrared absorbing agent (2): |

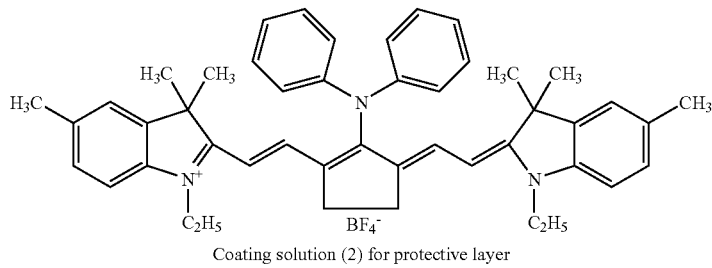

| Coating solution (2) for protective layer | |
|---|---|
| by Tokyo Chemical Industry Co., Ltd.) | |
| Copolymer of vinylpyrrolidone and vinyl acetate (LUVITEC VA64W, copolymerization ratio = 6/4, produced by ICP Co., Ltd.) | 0.01 g |
| Surfactant (EMALEX 710, produced by Nihon-Emulsion Co., Ltd.) | 0.01 g |
| Ion-exchanged water | 6.0 g |

Preparation of Dispersion of Inorganic Fine Particle (2)

To 193.6 g of ion-exchanged water was added 6.4 g of synthetic mica (Somasif ME-100, produced by CO-OP Chemical Co., Ltd.) and the mixture was dispersed using a homogenizer until an average particle size (according to a laser scattering method) became 0.5 μm to obtain a dispersion of inorganic fine particle. An aspect ratio of the inorganic fine particle thus-obtained was 1,000 or more.

Example 6

Lithographic printing plate precursor (6) was prepared in the same manner as in Example 5 except for using a dispersion of inorganic fine particle having an average particle size of 1.5 μm in place of the dispersion of inorganic fine particle having an average particle size of 0.5 μm used in Example 5.

Example 7

Lithographic printing plate precursor (7) was prepared in the same manner as in Example 5 except for using Dispersion of inorganic fine particle (1) in place of Dispersion of inorganic fine particle (2) used in Example 5.

Example 8

Coating solution (3) for image-recording layer having the composition shown below was coated on the same support as described in Example 1 by a bar and dried in an oven at 140° C. for 60 seconds to form an image-recording layer having a dry coating amount of 0.8 g/m². Subsequently, Coating solution (3) for protective layer having the composition shown below was coated on the image-recording layer by a bar and dried in an oven at 140° C. for 60 seconds to form an protective layer having a dry coating amount of 0.3 g/m², thereby preparing Lithographic printing plate precursor (8).

| Coating solution (3) for image-recording layer | |
|---|---|
| Binder polymer (1) shown above | 0.162 g |
| Polymerization initiator S-14 | 0.100 g |
| Infrared absorbing agent (2) shown above | 0.030 g |
| Polymerizable compound (Aronics M-215, produced by Toagosei Co., Ltd.) | 0.385 g |
| Fluorine-based surfactant (1) shown above | 0.044 g |

| -continued |  |
|---|---|
| Coating solution (3) for image-recording layer | |
| Methyl ethyl ketone | 1.091 g |
| 1-Methoxy-2-propanol | 8.609 g |
| Water | 2.425 g |
| Fine particle (1) shown above | 2.640 g |

| Coating solution (3) for protective layer | |
|---|---|
| Dispersion of inorganic fine particle (1) shown above | 3.0 g |
| Compound (1) shown below | 0.08 g |
| Polyvinyl alcohol (PVA-105, saponification degree: 98.5% by mole, polymerization degree: 500, produced by Kuraray Co., Ltd.) | 0.10 g |
| Polyvinylpyrrolidone (K30, molecular weight Mw: 40,000, produced by Tokyo Chemical Industry Co., Ltd.) | 0.02 g |
| Copolymer of vinylpyrrolidone and vinyl acetate (LUVITEC VA64W, copolymerization ratio = 6/4, produced by ICP Co., Ltd.) | 0.03 g |
| Surfactant (EMALEX 710, produced by Nihon-Emulsion Co., Ltd.) | 0.02 g |
| Ion-exchanged water | 6.0 g |

Compound (1):

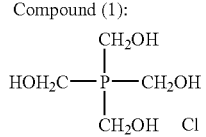

Examples 9 to 11

Lithographic printing plate precursors (9) to (11) were prepared in the same manner as in Example 8 except for using the compounds shown in Table 2 below in place of Compound (1) used in Example 8, respectively.

TABLE 2

| | Compound used |
|---|---|
| Example 9 | 4-[(2-hydroxyethyl)(methyl)amino]methyl-... benzyl compound with CH₂NCH₂CHCH₂OH, CH₃, OH substituents on phenyl ring |
| Example 10 | (CH₃)₄P⁺ Br⁻ (tetramethylphosphonium bromide) |
| Example 11 | Triphenylsulfonium benzoate (Ph₃S⁺ · C₆H₅-COCOO⁻) |

Comparative Example 1

Preparation of a lithographic printing plate precursor was conducted in the same manner as in Example 1 except for not forming the protective layer to prepare Comparative lithographic printing plate precursor (1).

Comparative Example 2

Preparation of a lithographic printing plate precursor was conducted in the same manner as in Example 5 except for not forming the protective layer to prepare Comparative lithographic printing plate precursor (2).

Comparative Example 3

Preparation of a lithographic printing plate precursor was conducted in the same manner as in Example 5 except for not adding the tetramethylammonium tetrafluoroborate to prepare Comparative lithographic printing plate precursor (3).

[Evaluation (1) of Lithographic Printing Plate Precursor]

With the lithographic printing plate precursors thus-obtained, the on-machine developing property, ink-receptive property and printing durability were determined to evaluate in the manner described below.

<On-Machine Developing Property>

The lithographic printing plate precursor was exposed by Trendsetter 3244VX produced by Creo Co., equipped with a water-cooled 40 W infrared semiconductor laser under the conditions of power of 9 W, a rotational number of an outer surface drum of 210 rpm and resolution of 2,400 dpi. The exposed lithographic printing plate precursor was mounted without conducting development processing on a plate cylinder of a printing machine (SOR-M produced by Hyderberg Co.). After supplying dampening water (prepared by diluting CDS803, produced by Tokyo Printing Ink Mfg. Co., Ltd. 50 times with water) and ink (TRANS-G (N) black ink (produced by Dainippon Ink and Chemicals, Inc.), printing was initiated at a printing speed of 6,000 sheets per hour. A number of printing papers required until on-machine development of the unexposed area of the image-recording layer on the printing machine was completed to reach a state where the ink was not transferred to the printing paper in the non-image area was determined to evaluate the on-machine developing property. As a result, in the case of using any of the lithographic printing plate precursors, prints free from stain in the non-image area were obtained within the printing of 100 sheets.

<Ink-Receptive Property>

After the initiation of printing, the ink gradually adhered on the image area of lithographic printing plate resulting in increase in density of the ink on the printing paper. A number of printing papers required until the ink density reach to the standard print density was determined to evaluate the ink-receptive property.

<Printing Durability>

After the ink-receiving, when the printing was further continued, the image-recording layer was gradually abraded. As the abrasion of image-recording layer proceeded, the ink-receptive property degraded, resulting in decrease in the ink density on printing paper. A number of prints obtained until the ink density (reflection density) decreased by 0.1 from that at the initiation of printing was determined to evaluate the printing durability.

The results of the evaluations are shown in Table 3 below.

TABLE 3

| Example No. | Printing Durability | Ink-receptive Property |
|---|---|---|
| Example 1 | 30,000 sheets | 10 sheets |
| Example 2 | 30,000 sheets | 10 sheets |
| Example 3 | 30,000 sheets | 10 sheets |
| Example 4 | 30,000 sheets | 10 sheets |
| Example 5 | 15,000 sheets | 50 sheets |
| Example 6 | 30,000 sheets | 20 sheets |
| Example 7 | 30,000 sheets | 10 sheets |
| Example 8 | 30,000 sheets | 10 sheets |
| Example 9 | 30,000 sheets | 10 sheets |
| Example 10 | 30,000 sheets | 10 sheets |
| Example 11 | 30,000 sheets | 10 sheets |
| Comparative Example 1 | 1,000 sheets | 10 sheets |
| Comparative Example 2 | 1,000 sheets | 20 sheets |
| Comparative Example 3 | 20,000 sheets | 100 sheets |

From the results shown in Table 3, it can be seen that with the lithographic printing plate precursors for comparison in which the protective layer was not provided or the protective layer using the inorganic stratiform compound which did not contain the organic cation was provided, either the printing durability or the ink-receptive property was poor. On the contrary, the lithographic printing plate precursors in Examples 1 to 11 having the protective layer including the inorganic stratiform compound containing the organic cation exhibited good on-machine developing property and provided good printing durability and ink-receptive property.

Examples 12 to 18

(Preparation of Support)

A support having an undercoat layer was prepared in the same manner as in Example 1 except for changing the dry coating amount of the undercoat layer to 6 mg/m² in the preparation of the support described in Example 1.

(Formation of Image-Recording Layer)

Coating solution (4) for image-recording layer having the composition shown below was coated on the above-described support by a bar and dried in an oven at 100° C. for 60 seconds to form an image-recording layer having a dry coating amount of 1.0 g/m². Coating solution (4) for image-recording layer was prepared by mixing and stirring Photosensitive solution (1) and Fine particle solution (2) respectively shown below just before the coating.

| Photosensitive solution (1) | |
|---|---|
| Binder polymer (1) shown above | 0.162 g |
| Polymerization initiator (1) shown below | 0.160 g |
| Polymerization initiator (2) shown below | 0.180 g |
| Infrared absorbing agent (3) shown below | 0.020 g |
| Polymerizable compound (Aronics M-215, produced by Toagosei Co., Ltd.) | 0.385 g |
| Fluorine-based surfactant (1) shown above | 0.044 g |
| Methyl ethyl ketone | 1.091 g |
| 1-Methoxy-2-propanol | 8.210 g |
| Phosphonium compound (A) shown in Table 4 below | Amount shown in Table 4 below |

Preparation of Fine Particle (2)

An oil phase component was prepared by dissolving 10 g of adduct of trimethylol propane and xylene diisocyanate (Takenate D-110N, produced by Mitsui Takeda Chemical Co., Ltd., 75% by weight ethyl acetate solution), 6.00 g of Aronix SR-399 (produced by Toagosei Co., Ltd.) and 0.12 g of Pionine A-41C (produced by Takemoto Oil and Fat Co., Ltd.) in 16.67 g of ethyl acetate. As an aqueous phase component, 37.5 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at a room temperature for 30 minutes and then at 40° C. for 2 hours. The thus obtained fine particle liquid was diluted using distilled water so as to have the solid concentration of 15% by weight. The average particle size of the fine particle was 0.2 μm.

(Formation of Protective Layer)

Coating solution (4) for protective layer having the composition shown below was coated on the image-recording layer by a bar and dried in an oven at 125° C. for 75 seconds

| Fine particle solution (2) | |
|---|---|
| Fine particle (2) prepared described below | 2.640 g |
| Water | 2.425 g |

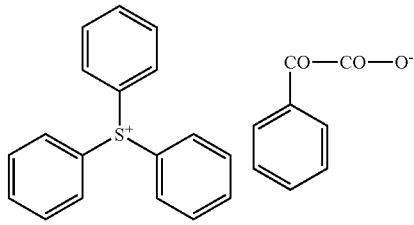

Polymerization initiator (1)

C$_4$F$_9$SO$_3^-$

Polymerization initiator (2)

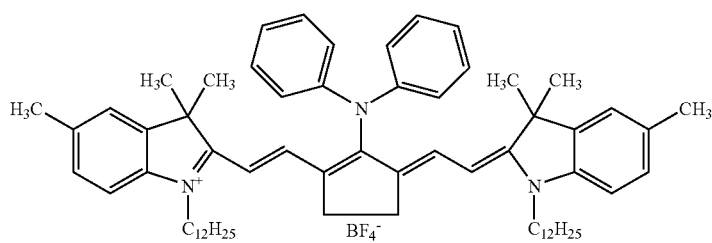

Infrared absorbing agent (3)

to form a protective layer having a dry coating amount of 0.15 g/m², thereby preparing a lithographic printing plate precursor.

| Coating solution (4) for protective layer | |
|---|---|
| Aqueous 6% by weight solution of polyvinyl alcohol (PVA-105, saponification degree: 98.5% by mole, polymerization degree: 500, produced by Kuraray Co., Ltd.) | 2.24 g |
| Polyvinylpyrrolidone (K30, molecular weight Mw: 40,000, produced by Tokyo Chemical Industry Co., Ltd.) | 0.0053 g |
| Aqueous 1% by weight solution of surfactant (EMALEX 710, produced by Kao Corp.) | 2.15 g |
| Aqueous 3.4% by weight dispersion of scaled synthetic mica (MEB3L, average particle size: 1 to 5 μmΦ, produced by UNICOO Co.) | 3.75 g |
| Distilled water | 10.60 g |

Examples 18 to 25

Coating solution (5) for image-recording layer having the composition shown below was coated on the same support having the undercoat layer as described in Example 12 by a bar and dried in an oven at 100° C. for 60 seconds to form an image-recording layer having a dry coating amount of 1.3 g/m². Subsequently, the protective layer was provided on the image-recording layer in the same manner as in Example 12, thereby preparing a lithographic printing plate precursor.

Coating solution (5) for image-recording layer was prepared by mixing and stirring Photosensitive solution (2) shown below and Fine particle solution (2) shown above just before the coating.

| Photosensitive solution (2) | |
|---|---|
| Binder polymer (1) shown above | 0.162 g |
| Polymerization initiator (3) shown below | 0.180 g |
| Infrared absorbing agent (2) shown above | 0.038 g |
| Polymerizable compound (Aronics M-215, produced by Toagosei Co., Ltd.) | 0.385 g |
| Fluorine-based (1) shown above | 0.044 g |
| Methyl ethyl ketone | 1.091 g |
| 1-Methoxy-2-propanol | 8.210 g |
| Phosphonium compound (A) shown in Table 4 below | Amount shown in Table 4 below |

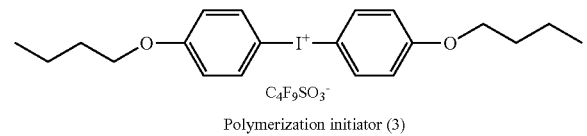

Polymerization initiator (3)

Comparative Example 4

A lithographic printing plate precursor for comparison was prepared in the same manner as in Example 12 except for not adding the phosphonium compound to Photosensitive solution (1).

Comparative Example 5

A lithographic printing plate precursor for comparison was prepared in the same manner as in Example 18 except for not adding the phosphonium compound to Photosensitive solution (2).

[Evaluation (2) of Lithographic Printing Plate Precursor]

With the lithographic printing plate precursors thus-obtained, the on-machine developing property, printing sensitivity and printing durability were determined to evaluate in the manner described below. The results of the evaluations are shown in Table 4 below.

<On-Machine Developing Property>

The lithographic printing plate precursor was exposed by Trendsetter 3244VX, produced by Creo Co., equipped with a water-cooled 40 W infrared semiconductor laser under the conditions of power of 9 W, a rotational number of an outer surface drum of 150 rpm and resolution of 2,400 dpi. The exposed lithographic printing plate precursor was mounted on a plate cylinder of a printing machine (SOR-M, produced by Hyderberg Co.). After supplying dampening water [Ecolity 2 (etching solution, produced by Fuji Photo Film Co., Ltd.)/water=2/98 (volume ratio)] and ink (TRANS-G (N) black ink (produced by Dainippon Ink and Chemicals, Inc.), 100 sheets of printing was conducted at a printing speed of 6,000 sheets per hour. A number of printing papers required until on-machine development of the unexposed area of the image-recording layer on the printing machine was completed to reach a state where the ink was not transferred to the printing paper in the non-image area was determined to evaluate the on-machine developing property.

<Printing Sensitivity>

Using the above-described Trendsetter 3244VX fine lines were exposed under the conditions of a rotational number of an outer surface drum of 150 rpm and resolution of 2,400 dpi, while changing power to 3.2 W, 4.5 W, 6.4 W and 9.6 W, respectively. The exposed lithographic printing plate precursor was mounted on a plate cylinder of a printing machine (SOR-M, produced by Hyderberg Co.). After supplying dampening water [IF 102 (etching solution, produced by Fuji Photo Film Co., Ltd.)/water=3/97 (volume ratio)] and ink (TRANS-G (N) black ink (produced by Dainippon Ink and Chemicals, Inc.), 100 sheets of printing was conducted at a printing speed of 6,000 sheets per hour. An exposure amount which could be reproduced fine lines of 10 μm without interruption on the printing paper was determined to evaluate the printing sensitivity.

<Printing Durability>

After the evaluation of on-machine developing property as described above, the printing was further continued. As the number of printing sheets was increased, ink density on the printing paper decreased. A number of prints obtained until the ink density (reflection density) decreased by 0.1 from that at the initiation of printing was determined to evaluate the printing durability.

TABLE 4

| | Image-recording Layer | | | On-machine Developing Property (number of sheets) | Printing Sensitivity [power for reproducing 10 μm lines] | Printing Durability (×1,000 sheets) |
|---|---|---|---|---|---|---|
| | Kind of Photosensitive Solution | Kind of Phosphonium Compound (A) | Amount of Phosphonium Compound (A) (g) | | | |
| Example 12 | 1 | A-1 | 0.013 | 23 sheets | 3.2 W | 5.5 |
| Example 13 | 1 | A-1 | 0.040 | 19 sheets | 3.2 W | 6.0 |
| Example 14 | 1 | A-1 | 0.067 | 19 sheets | 3.2 W | 6.0 |
| Example 15 | 1 | A-2 | 0.013 | 23 sheets | 3.2 W | 5.5 |
| Example 16 | 1 | A-2 | 0.040 | 22 sheets | 3.2 W | 5.5 |
| Example 17 | 1 | A-2 | 0.067 | 22 sheets | 3.2 W | 5.5 |
| Comparative Example 4 | 1 | none | — | 24 sheets | 3.2 W | 3.0 |
| Example 18 | 2 | A-1 | 0.012 | 19 sheets | 3.2 W | 6.0 |
| Example 19 | 2 | A-1 | 0.036 | 19 sheets | 3.2 W | 6.5 |
| Example 20 | 2 | A-1 | 0.060 | 19 sheets | 3.2 W | 6.5 |
| Example 21 | 2 | A-2 | 0.012 | 18 sheets | 3.2 W | 6.0 |
| Example 22 | 2 | A-2 | 0.036 | 19 sheets | 3.2 W | 6.0 |
| Example 23 | 2 | A-2 | 0.060 | 18 sheets | 3.2 W | 6.0 |
| Comparative Example 5 | 2 | none | — | 20 sheets | 3.2 W | 1.0 |
| Example 24 | 2 | A-3 | 0.060 | 17 sheets | 3.2 W | 6.5 |
| Example 25 | 2 | A-4 | 0.060 | 18 sheets | 3.2 W | 6.0 |

Example 26

Coating solution (5) for protective layer having the composition shown below was coated on the same image-recording layer as in Comparative Example 5 by a bar and dried in an oven at 125° C. for 75 seconds to form a protective layer having a dry coating amount of 0.15 g/m², thereby preparing a lithographic printing plate precursor.

| Coating solution (5) for protective layer | |
|---|---|
| Aqueous 6% by weight solution of polyvinyl alcohol (PVA-105, saponification degree: 98.5% by mole, polymerization degree: 500, produced by Kuraray Co., Ltd.) | 2.24 g |
| Polyvinylpyrrolidone (K30, molecular weight Mw: 40,000, produced by Tokyo Chemical Industry Co., Ltd.) | 0.0053 g |
| Aqueous 1% by weight solution of surfactant (EMALEX 710, produced by Kao Corp.) | 2.15 g |
| Aqueous 3.4% by weight dispersion of scaled synthetic mica (MEB3L, average particle size: 1 to 5 μmΦ, produced by UNICOO Co.) | 3.75 g |
| Phosphonium compound (A-1) | 0.20 g |
| Distilled water | 10.60 g |

The lithographic printing plate precursor thus-obtained was evaluated in the same manner as in Example 12. The results of the evaluations are shown in Table 5 below.

TABLE 5

| | On-machine Developing Property | Printing Sensitivity | Printing Durability (×10 sheets) |
|---|---|---|---|
| Example 26 | 17 sheets | 3.2 W | 6.0 |

From the results shown in Tables 4 and 5, it can be seen that the lithographic printing plate precursor according to the invention is excellent in the printing durability (ink-receptive property) while maintaining good on-machine developing property in comparison with conventional lithographic printing plate precursors (Comparative Examples 4 to 5).

Example 27 and Comparative Example 6

In Example 27, the same procedure as in Comparative Example 5 was conducted except for changing the dampening water to a solution prepared by diluting α Solution shown in Table 6 below to 3% by volume with water. In Comparative Example 6, the same procedure as in Comparative Example 5 was conducted except for changing the dampening water to a solution prepared by diluting β Solution shown in Table 6 below to 3% by volume with water. The results obtained are shown in Table 7 below.

TABLE 6

Composition of Dampening Water (unit: % by weight)

|  | α Solution | β Solution |
| --- | --- | --- |
| Pure water | 35.6 | 36.6 |
| Propylene glycol mono-n-butyl ether | 28.4 | 28.4 |
| Propylene glycol | 25.0 | 25.0 |
| Octanediol | 4.7 | 4.7 |
| Glycerin | 1.0 | 1.0 |
| Maleic acid | 1.9 | 1.9 |
| KOH (48% by weight aqueous solution) | 2.3 | 2.3 |
| Ammonium nitrate | 0.3 | 0.3 |
| Ammonium phosphate secondary | 0.3 | 0.3 |
| Magnesium sulfate | 0.8 | 0.8 |
| Citric acid | 0.2 | 0.2 |
| Ammonium citrate secondary | 0.7 | 0.7 |
| Compound A-1 | 0.1 | none |
| 1,2-Benzisothiazol-3(2H)-one | 0.6 | 0.6 |
| Total | 100.0 | 100.0 |

TABLE 7

|  | No. | |
| --- | --- | --- |
|  | Example 27 | Comparative Example 6 |
| Kind of Dampening Water | α Solution | β Solution |
| On-machine Developing Property (number of sheets) | 15 | 15 |
| Printing Sensitivity [power for reproducing 10 μm lines] | 3.2 | 3.2 |
| Printing Durability (×1,000 sheets) | 7 | 1 |

From the results shown in Tables 7, it can be seen that the lithographic printing method using the dampening water containing the phosphonium compound according to the invention is excellent in the printing durability (ink-receptive property) while maintaining good on-machine developing property in comparison with a lithographic printing method using conventional dampening water (Comparative Example 6).

This application is based on Japanese Patent application JP 2005-54181, filed Feb. 28, 2005, and Japanese Patent application JP 2005-88354, filed Mar. 25, 2005, the entire contents of which are hereby incorporated by reference, the same as if set forth at length.

What is claimed is:

1. A lithographic printing method, comprising, in the following order:
(a) imagewise exposing with a laser beam a lithographic printing plate precursor comprising:
a support;
an image-recording layer; and
a protective layer containing an inorganic stratiform compound,
provided in this order,
wherein the inorganic stratiform compound contains an organic cation, and
wherein the protective layer comprises two or more water-soluble polymers, and at least one of the water-soluble polymers is polyvinyl alcohol;
(b) supplying dampening water and oily ink to the imagewise exposed lithographic printing plate precursor on a printing machine, so as to remove an unexposed area of the image-recording layer; and
(c) conducting printing.

2. The lithographic printing method as claimed in claim 1, wherein the inorganic stratiform compound has a particle size of 1 μm or more.

3. The lithographic printing method as claimed in claim 1, wherein the image-recording layer contains (A) an active ray absorbing agent, (B) a polymerization initiator, and (C) a polymerizable compound.

4. The lithographic printing method as claimed in claim 1, wherein the organic cation is a cation of an organic cationic compound, and wherein the organic cationic compound is a phosphonium salt.

5. The method as claimed in claim 4, wherein the phosphonium salt is a compound represented by the following formula (I):

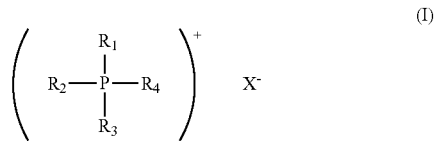

wherein $R_1$ to $R_4$ each independently represents an alkyl group, an alkenyl group, an alkynyl group, a cycloalkyl group, an alkoxy group, an aryl group, an aryloxy group, an alkylthio group, an arylthio group, a heterocyclic group or a hydrogen atom, or at least two of $R_1$ to $R_4$ may be combined with each other to from a ring, and $X^-$ represents an anion.

6. The method as claimed in claim 5, wherein the anion represented by $X^-$ in formula (I) is $Cl^-$, $Br^-$, $I^-$ or an organic carboxylic acid anion or organic sulfonic acid anion having a substituent selected from an alkyl group, an alkenyl group, an alkynyl group, a cycloalkyl group, an alkoxy group, an aryl group, an aryloxy group, an alkylthio group and a heterocyclic group.

7. The lithographic printing method as claimed in claim 1, wherein at least one of the two or more water-soluble polymers is polyvinyl alcohol, and at least one of the two or more water-soluble polymers is modified polyvinyl alcohol, polyvinyl pyrrolidone or gum arabic.

8. The lithographic printing method as claimed in claim 1, wherein the inorganic stratiform compound in the protective layer is mica.

9. The lithographic printing method as claimed in claim 7, wherein the inorganic stratiform compound in the protective layer is mica.

10. A lithographic printing method comprising after image exposure of a lithographic printing plate precursor comprising a support, an image-recording layer, and a protective layer containing an inorganic stratiform compound, provided in this order, supplying oily ink and dampening water to the lithographic printing plate precursor on a printing machine to remove an unexposed area of an image-recording layer of the lithographic printing plate precursor and conducting printing, wherein the dampening water contains a phosphonium compound represented by the following formula (I):

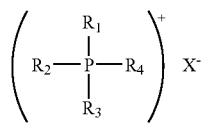

wherein $R_1$ to $R_4$ each independently represents an alkyl group, an alkenyl group, an alkynyl group, a cycloalkyl group, an alkoxy group, an aryl group, an aryloxy group, an alkylthio group, an arylthio group, a heterocyclic group or a hydrogen atom, or at least two of $R_1$ to $R_4$ may be combined with each other to from a ring, and $X^-$ represents an anion and wherein the protective layer comprises two or more water-soluble polymers, and at least one of the water-soluble polymers is polyvinyl alcohol.

* * * * *